(12) United States Patent
Sivero

(10) Patent No.: US 12,283,346 B2
(45) Date of Patent: Apr. 22, 2025

(54) LOCALLY EMBEDDED BAD SECTOR MARKING FOR A MEMORY

(71) Applicant: Ferroelectric Memory GmbH, Dresden (DE)

(72) Inventor: Stefano Sivero, Comun Nuovo (IT)

(73) Assignee: FERRORELECTRIC MEMORY GMBH, Dresden (DE)

( * ) Notice: Subject to any disclaimer, the term of this patent is extended or adjusted under 35 U.S.C. 154(b) by 221 days.

(21) Appl. No.: 17/662,382

(22) Filed: May 6, 2022

(65) Prior Publication Data

US 2023/0360684 A1    Nov. 9, 2023

(51) Int. Cl.
G11C 11/22    (2006.01)
G11C 8/08    (2006.01)

(52) U.S. Cl.
CPC ..................... *G11C 8/08* (2013.01)

(58) Field of Classification Search
CPC .............. G11C 8/08; G11C 2029/0409; G11C 2029/4402; G11C 11/22; G11C 16/08; G11C 29/4401; G11C 29/883
See application file for complete search history.

(56) References Cited

U.S. PATENT DOCUMENTS

| | | |
|---|---|---|
| 10,978,129 B1 | 4/2021 | Muller |
| 11,081,159 B1 | 8/2021 | Jehne et al. |
| 11,189,331 B1 | 11/2021 | Benoist et al. |
| 11,195,589 B1 | 12/2021 | Ocker et al. |
| 11,393,518 B1 | 7/2022 | Ocker |
| 11,443,792 B1 | 9/2022 | Iqbal et al. |
| 11,475,935 B1 | 10/2022 | Ocker |
| 11,508,426 B1 | 11/2022 | Ocker |
| 2019/0130956 A1 | 5/2019 | Muller et al. |
| 2019/0130957 A1 | 5/2019 | Muller |
| 2019/0325963 A1 | 10/2019 | Noack |
| 2020/0027493 A1 | 1/2020 | Muller et al. |
| 2020/0357455 A1 | 11/2020 | Noack et al. |
| 2020/0357470 A1 | 11/2020 | Noack |
| 2021/0005238 A1 | 1/2021 | Muller |
| 2021/0082958 A1 | 3/2021 | Mennenga et al. |
| 2021/0090662 A1 | 3/2021 | Mennenga et al. |
| 2021/0091097 A1 | 3/2021 | Mennenga |
| 2021/0125656 A1 | 4/2021 | Muller |
| 2021/0217454 A1 | 7/2021 | Ocker |
| 2021/0312969 A1 | 10/2021 | Noack et al. |
| 2021/0327901 A1 | 10/2021 | Noack |
| 2021/0336534 A1 | 10/2021 | Iqbal et al. |
| 2022/0020776 A1 | 1/2022 | Mennenga et al. |
| 2022/0060105 A1 | 2/2022 | Iqbal |
| 2022/0122995 A1 | 4/2022 | Ocker et al. |
| 2022/0122996 A1 | 4/2022 | Ocker et al. |
| 2022/0122999 A1 | 4/2022 | Polakowski |

(Continued)

*Primary Examiner* — Hien N Nguyen
(74) *Attorney, Agent, or Firm* — Synergy IP Group AG

(57) ABSTRACT

Disclosed herein is a memory arrangement and method thereof for locally marking bad memory cells. The memory arrangement includes a group of memory cells and a driver circuit for operating the group of memory cells. The driver circuit includes a remanent-polarizable memory element (e.g., a remanent-polarizable field-effect transistor). Depending on a memory state of the remanent-polarizable memory element, the driver circuit enables or disables the operation (e.g., a read/write operation) on the group of memory cells.

18 Claims, 9 Drawing Sheets

(56) References Cited

U.S. PATENT DOCUMENTS

| | | |
|---|---|---|
| 2022/0139437 A1 | 5/2022 | Ocker |
| 2022/0139931 A1 | 5/2022 | Ocker |
| 2022/0139932 A1 | 5/2022 | Polakowski |
| 2022/0139933 A1 | 5/2022 | Noack |
| 2022/0139934 A1 | 5/2022 | Muller |
| 2022/0139936 A1 | 5/2022 | Ocker |
| 2022/0139937 A1 | 5/2022 | Muller et al. |
| 2022/0172791 A1 | 6/2022 | Schenk |
| 2022/0173114 A1 | 6/2022 | Schenk |
| 2022/0189524 A1 | 6/2022 | Ocker |
| 2022/0199166 A1 | 6/2022 | Mennenga et al. |
| 2022/0270659 A1 | 8/2022 | Ocker |
| 2022/0277794 A1 | 9/2022 | Noack |
| 2022/0374202 A1 | 11/2022 | Villa et al. |
| 2022/0376114 A1 | 11/2022 | Muller |
| 2023/0007890 A1* | 1/2023 | Yeh .................. G11C 11/4094 |
| 2023/0041759 A1 | 2/2023 | Noack et al. |
| 2023/0046259 A1 | 2/2023 | Iqbal |
| 2023/0135718 A1 | 5/2023 | Minh et al. |
| 2023/0170029 A1 | 6/2023 | Sivero |
| 2023/0189531 A1 | 6/2023 | Muller |
| 2023/0189532 A1 | 6/2023 | Muller |
| 2023/0223066 A1 | 7/2023 | Muller |
| 2023/0247842 A1 | 8/2023 | Muller |
| 2023/0284454 A1 | 9/2023 | Ocker et al. |
| 2023/0335174 A1* | 10/2023 | Kuzmanov ......... G11C 11/2275 |
| 2023/0360684 A1 | 11/2023 | Sivero |
| 2023/0371268 A1 | 11/2023 | Muller |

\* cited by examiner

LOCALLY EMBEDDED BAD SECTOR MARKING FOR A MEMORY

TECHNICAL FIELD

Various aspects are related to computer memories, and in particular, circuits and methods for locally embedding a bad sector marker within a driver circuit for a memory.

BACKGROUND

A memory such as non-volatile memory (NVM) includes numerous memory cells. As part of the process for manufacturing a memory or over time, individual memory cells may be or may become corrupt. If a memory cell is corrupt, the NVM cannot reliably read/write information in the memory cell. As such, the address (i.e., its physical location in the NVM) for the corrupt memory cell is typically marked as a "bad" so that it is no longer physically addressed and is instead logically replaced with a good memory cell in a different physical location (e.g., from a set of redundant cells). This marking of bad cells may be on a "sector" (or "block" for NAND-based memories) basis, depending on how the memory cells are grouped. Typically, to mark bad sectors, the physical address of each bad sector is stored in the NVM and then read-out during a power-on scan to mark bad sectors. Each time the memory is powered up, the addresses of the bad sectors are loaded from the NVM, the entire memory is scanned to locate each bad address, and a latch is set in the sector's row driver circuit to identify the sector as a good or bad sector. This type of process for marking bad sectors adds costs (1) in terms of time to read bad sector addresses from the NVM and to scan the entire memory to set the latch of each bad sector and (2) in terms of storage space to store the list of bad sectors and in terms of additional circuitry (e.g., a latch) for each sector.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which.

DESCRIPTION

Figure 1:
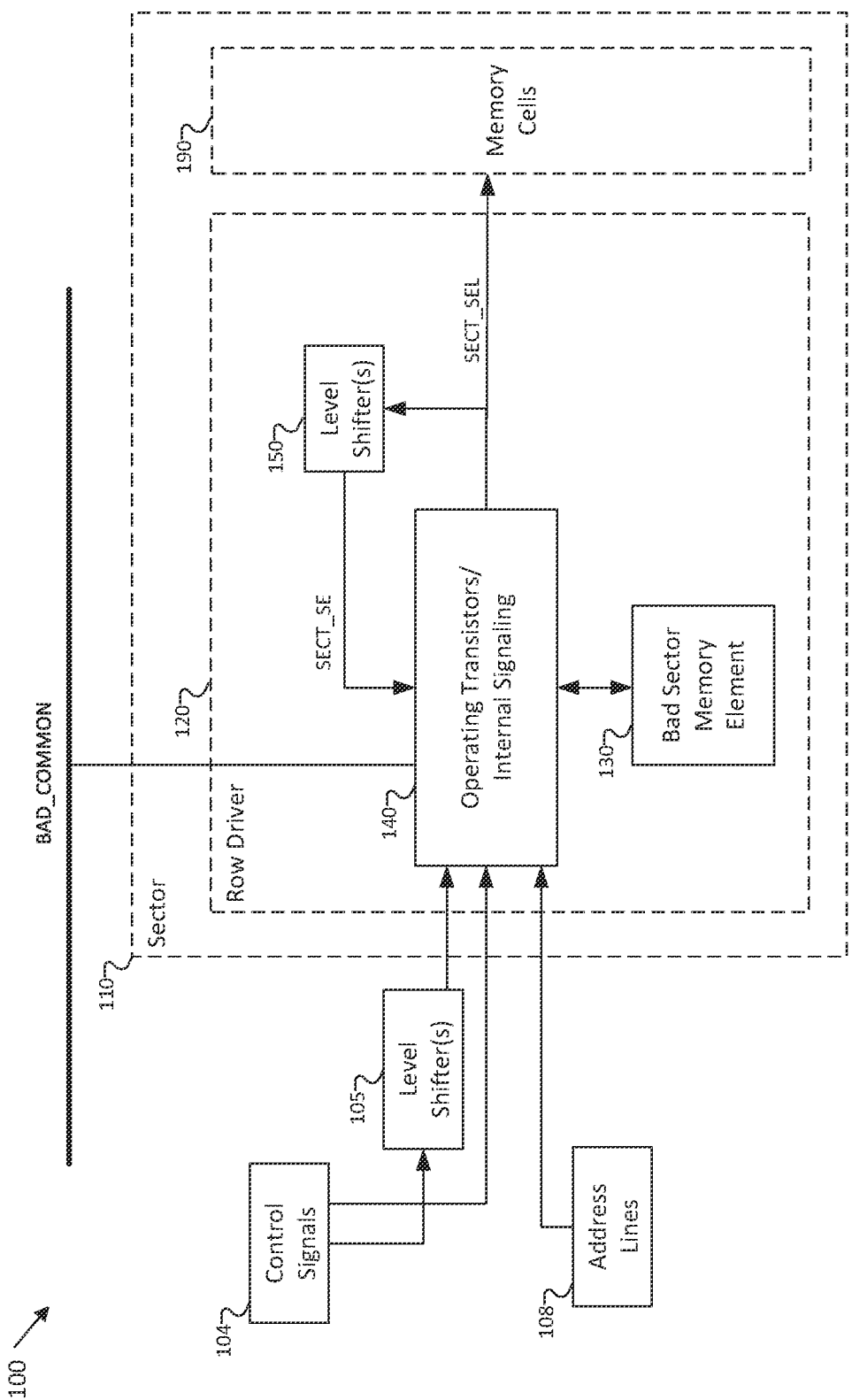
FIG. 1 shows an exemplary block diagram of a bad sector marking system that may embed the bad sector marking in the sector's driver circuit.

The following detailed description refers to the accompanying drawings that show, by way of illustration, specific details and aspects in which the invention may be practiced. These aspects are described in sufficient detail to enable those skilled in the art to practice the invention. Other aspects may be utilized and structural, logical, and electrical changes may be made without departing from the scope of the invention. The various aspects are not necessarily mutually exclusive, as some aspects may be combined with one or more other aspects to form new aspects. Various aspects are described in connection with methods and various aspects are described in connection with devices (e.g., a circuit, a memory, a memory cell, a memory element, a memory array, a reference sector, a dividing circuit, a shifting circuit, etc.). It should be understood that aspects described in connection with methods may similarly apply to devices and vice versa.

In non-volatile memories, memory cells may be bad at manufacturing or become corrupt over time. If a memory cell is bad or becomes corrupt, the NVM may not be able to reliably store/retrieve information to/from the memory cell. To avoid data loss, the NVM may mark such cells as "bad" so that the corrupt memory cell is no longer used for storing/retrieving information. This is typically done using logical addressing, where the physical address of a bad memory cell is marked as bad and it is logically remapped to a good memory cell at a different physical address (e.g., from a set of "redundant" memory cells that are reserved for replacing corrupt memory cells). Marking of bad cells may be done on a "sector" basis (or "block" basis for NAND memories), depending on the arrangement of memory cells and how the memories may be grouped together. (As should be appreciated, the term "block" may be used interchangeably with the term "sector," referring to any grouping of memory cells into an addressable unit. A sector or block may be understood as the smallest erasable area (e.g., smallest erasable grouping of memory cell(s)) of the memory. Typically, to mark bad sectors, the physical address of each bad sector is stored in a table in the memory and then it is read-out during a power-on scan to mark bad sectors. Each time the memory is powered up, the addresses of the bad sectors are loaded from the table in the memory, the entire memory is scanned to locate each bad address, and a latch is set in the sector's row driver circuit to identify the sector as a good or bad sector. This type of process for marking bad sectors adds costs (1) in terms of time to read bad sector addresses from the NVM and to scan the entire memory to set the latch of each bad sector and (2) in terms of storage space to store the list of bad sectors and in terms of additional circuitry (e.g., a latch) for each sector.

As discussed in more detail below, the disclosed bad sector marking system may locally embed the bad sector marking directly in the driver circuit so that the memory need not—each time at power-up—obtain bad sector addresses from the memory, scan the entire memory, and program a latch to mark each of the bad sectors. To do so, the bad sector marking system disclosed below may use a locally embedded memory element as a bad sector marker to indicate whether the sector is bad.

The locally embedded memory element may be a remanent-polarizable memory element that retains bad sector information even when the power is switched off. The remanent-polarizable memory element may be formed, for example, by coupling a gate of a field-effect transistor structure with a remanent-polarizable capacitive memory structure, or by integrating a remanent-polarizable memory structure in the gate structure of a field-effect transistor structure. In such a configuration, the functional layer (e.g., a remanent-polarizable capacitive memory element) may be in a capacitive environment, e.g., disposed between two electrode layers or disposed between a channel of a field-effect transistor and an electrode layer (e.g., a gate electrode of the field-effect transistor). As such, the state (e.g., the polarization state) of the memory element influences the threshold voltage of the field-effect transistor structure (e.g., a first state of the memory element may be associated with a first threshold voltage, such as a low threshold voltage, and a second state of the memory element may be associated with a second threshold voltage, such as a high threshold voltage). A field-effect transistor structure that includes a remanent-polarizable capacitive memory structure may be referred to as field-effect transistor-based memory element, a field-effect transistor-based capacitive memory element, a field-effect transistor-based memory structure, and/or a ferroelectric field-effect-transistor (FeFET). It is noted that even though various aspects of a locally embedded memory element are described herein with reference to a field-effect transistor-based capacitive memory element (such as a FeFET), other types of remanent memory structures may be suitable as well.

According to various aspects, a threshold voltage of a field-effect transistor structure (and in a corresponding manner the threshold voltage of a locally-embedded field-effect transistor-based memory element) may be defined as a constant current threshold voltage (referred to as $V_{th}(ci)$). In this case, the constant current threshold voltage, $V_{th}(ci)$, may be a determined gate source voltage, $V_{GS}$, at which the drain current (referred to as $I_D$) is equal to a predefined (constant) current. The predefined (constant) current may be a reference current (referred to as $I_{DO}$) times the ratio of gate width (W) to gate length (L). The magnitude of the reference current, $I_{DO}$, may be selected to be appropriate for a given technology, e.g. 0.1 µA. In some aspects, the constant current threshold voltage, $V_{th}(ci)$, may be determined based on the following equation:

$$V_{th}(ci)=V_{GS}(\text{at } I_D=I_{DO}\cdot W/L).$$

A threshold voltage of a field-effect transistor structure may be defined by the properties of the field-effect transistor structure (e.g., the materials, the doping, etc.), and it may thus be a (e.g., intrinsic) property of the field-effect transistor structure.

According to various aspects, a memory element may have at least two distinct memory states associated therewith, for example with two distinct electrical conductivities or two distinct amounts of stored charge that indicate in which of the at least two distinct states the memory element is residing. A field-effect transistor-based memory element may include a first memory state, for example associated with a low threshold voltage state (referred to as the LVT state and associated with the LVT memory state), and a second memory state, for example associated with a high threshold voltage state (referred to as the HVT state and associated with the HVT memory state). The high threshold voltage state may be, in some aspects, associated with a lower current flow during readout than the low threshold voltage state. The low threshold voltage state may be an electrically conducting state (e.g., associated with a logic memory state "1", also referred to as a first memory state, first programming state, or programmed state) and the high threshold voltage state may be an electrically non-conducting state or at least less conducting than the low threshold voltage state (e.g., associated with a logic memory state "0", also referred to as a second memory state, second programming state, or erased state). Of course, the definition of the LVT state and the HVT state; the definition of a logic "0" and a logic "1"; the definition of first/second memory state; the definition of first/second programming state; and/or the definition of "programmed state" and "erased state" may be selected arbitrarily. Illustratively, the first memory state may be associated with a first threshold voltage of the FET-based memory cell, and the second memory state may be associated with a second threshold voltage of the FET-based memory cell.

According to various aspects, the remanent polarization of the memory element (e.g., the remanent polarization of a spontaneously-polarizable layer) may define the memory state in which the memory is residing. According to various aspects, a memory element may reside in a first memory state in the case that the memory element is in a first polarization state, and the memory element may reside in a second memory state in the case that the memory element is in a second polarization state (e.g., opposite to the first polarization state, illustratively with the polarization pointing in an opposite direction). As an example, the polarization state of the memory element may determine the amount of charge stored in the capacitive memory structure. The amount of charge stored in the capacitive memory structure may define its memory state. The threshold voltage of a field-effect transistor structure may be a function of the polarization state of the memory element, e.g. may be a function of the amount and/or polarity of charge stored in the capacitive memory structure. A first threshold voltage, e.g. a low threshold voltage $V_{L-th}$, may be associated with the first polarization state (e.g., with the first amount and/or polarity of stored charge), and a second threshold voltage, e.g. a high threshold voltage $V_{H-th}$, may be associated with the second polarization state (e.g., with the second amount and/or polarity of stored charge). A current flow from nodes to which the field-effect transistor structure and the capacitive memory structure are coupled may be used to determine the memory state in which the memory cell is residing. As an example, the first polarization state may include a positive polarization, and the second polarization state may include a negative polarization.

According to various aspects, writing a memory element may include an operation or a process that modifies the memory state in which the memory element is residing from a (e.g., first) memory state to another (e.g., second) memory state. According to various aspects, writing a memory element may include programming a memory element (e.g., performing a programming operation of a memory element), wherein the memory state in which it resides after programming may be called the "programmed state." For example, programming an n-type FET-based memory element may modify its state from the HVT state to the LVT state, whereas programming a p-type FET-based memory element may modify its state from the LVT state to the HVT state. According to various aspects, writing a memory element may include erasing a memory element (e.g., performing an erasing operation of a memory element), wherein its memory state after the erasing may be called the "erased state." For example, erasing an n-type FET-based memory element may modify its state from the LVT state to the HVT state, whereas erasing a p-type FET-based element may modify its state from the HVT state to the LVT state.

According to various aspects, a memory element (e.g., the memory element of a capacitive memory structure coupled to or integrated in a field-effect transistor structure) may include or may be made of a polarizable material, e.g., a spontaneously-polarizable material. A spontaneously-polarizable memory element (e.g., a spontaneously-polarizable layer) may show a hysteresis in the (voltage dependent) polarization. The spontaneously-polarizable memory element may show non-remanent spontaneous polarization (e.g., may show anti-ferroelectric properties), e.g., the spontaneously-polarizable memory element may have no or no substantial remanent polarization remaining in the case that no voltage drops over the spontaneously-polarizable memory element. In other aspects, the spontaneously-polarizable memory element may show remanent spontaneous polarization (e.g., may show ferroelectric properties), e.g., the spontaneously-polarizable memory element may have a remanent polarization or a substantial remanent polarization remaining in the case that there is no applied voltage drop over the spontaneously-polarizable memory element.

The terms "spontaneously polarized" or "spontaneous polarization" may be used herein, for example, with reference to the polarization capability of a material beyond dielectric polarization. A "spontaneously-polarizable" (or "spontaneous-polarizable") material may be or may include a spontaneously-polarizable material that shows a remanence, e.g., a ferroelectric material, and/or a spontaneously-polarizable material that shows no remanence, e.g., an anti-ferroelectric material. The coercivity of a material may be a measure of the strength of the reverse polarizing electric field that may be required to remove a remanent polarization.

A spontaneous polarization (e.g., a remanent or non-remanent spontaneous polarization) may be evaluated via analyzing one or more hysteresis measurements (e.g., hysteresis curves), e.g., in a plot of polarization, P, versus electric field, E, in which the material is polarized into opposite directions. The polarization capability of a material (dielectric polarization, spontaneous polarization, and a remanence characteristics of the polarization) may be analyzed using capacity spectroscopy, e.g., via a static (C-V) and/or time-resolved measurement or by polarization-voltage (P-V) or positive-up-negative-down (PUND) measurements.

According to various aspects, in various types of applications, e.g., in memory technology, a very low remanent polarization may be regarded as no substantial remanent polarization (e.g. 0 µC/cm² to 3 µC/cm²). Such low values of a remanent polarization may be present in a layer or material due to undesired effects, e.g., due to a not ideal layer formation. According to various aspects, in various types of applications, e.g., in memory technology, a high remanent polarization (e.g., greater than 3 µC/cm²) may be regarded as substantial remanent polarization. Such a substantial remanent polarization may allow for storing information as a function of a polarization state of a spontaneously-polarizable layer or a spontaneously-polarizable material.

In general, a remanent polarization (also referred to as retentivity, remanence, or residual polarization) may be present in a material layer in the case that the material layer may remain polarized upon reduction of an applied electric field (E) to zero, therefore, a certain value for the electrical polarization (P) of the material layer may be detected. Illustratively, a polarization remaining in a material when the electric field is reduced to zero may be referred to as remanent polarization. Therefore, the remanence of a material may be a measure of the remanent polarization in the material in the case that an applied electric field is removed. In general, ferroelectricity and anti-ferroelectricity may be concepts to describe a remanent polarization of a material similar to ferromagnetism and anti-ferromagnetism used to describe remanent magnetization in magnetic materials. According to various aspects, an electric coercive field, $E_C$, (also referred to as coercive field) may be or represent the electric field required to depolarize a remanent-polarizable layer.

According to various aspects, a spontaneously-polarizable memory element may include or may consist of a remanent-polarizable material. A remanent-polarizable material may be a material that is remanently polarizable and shows a remanence of the spontaneous polarization, such as a ferroelectric material. In other aspects, a remanent-polarizable material may be a material that is spontaneously-polarizable and that shows no remanence, e.g., an anti-ferroelectric material under the additional conditions that measures are implemented to generate an internal electric-field within the anti-ferroelectric material. An internal electric-field within an anti-ferroelectric material may be caused (e.g., applied, generated, maintained, as examples) by various strategies: e.g., by implementing floating nodes that may be charged to voltages different from zero volts, and/or by implementing charge storage layers, and/or by using doped layers, and/or by using electrode layers that adapt electronic work-functions to generate an internal electric field, only as examples. A spontaneously-polarizable memory element including or being made of a remanent-polarizable material may be referred to herein as remanent-polarizable memory element (e.g., as remanent-polarizable layer).

In some aspects, a spontaneous-polarizable material (e.g., a remanent-polarizable material) may be based on at least one metal oxide. Illustratively, a composition of the spontaneous-polarizable material may include the at least one metal oxide for more than 50%, or more than 66%, or more than 75%, or more than 90%. In some aspects, the spontaneous-polarizable material may include one or more metal oxides. The spontaneous-polarizable material may include (or may be based on) at least one of $Hf_aO_b$, $Zr_aO_b$, $Si_aO_b$, $Y_aO_b$, as examples, wherein the subscripts "a" and "b" may indicate the number of the respective atom in the spontaneous-polarizable material.

In some aspects, the spontaneous-polarizable material (e.g., the remanent-polarizable material) may be or may include a ferroelectric material, illustratively a memory element may be ferroelectric memory element (for example a ferroelectric layer). A ferroelectric material may be an example of a material used in a spontaneously-polarizable memory element (e.g., in a remanent-polarizable element). The ferroelectric material may be or may include at least one of the following: hafnium oxide (ferroelectric hafnium oxide, $HfO_2$), zirconium oxide (ferroelectric zirconium oxide, $ZrO_2$), a (ferroelectric) mixture of hafnium oxide and zirconium oxide. Ferroelectric hafnium oxide may include any form of hafnium oxide that may exhibit ferroelectric properties. Ferroelectric zirconium oxide may include any form of zirconium oxide that may exhibit ferroelectric properties. This may include, for example, hafnium oxide, zirconium oxide, a solid solution of hafnium oxide and zirconium oxide (e.g., but not limited to it, a 1:1 mixture) or hafnium oxide and/or zirconium oxide doped or substituted with one or more of the following elements (non-exhaustive list): silicon, aluminum, gadolinium, yttrium, lanthanum, strontium, zirconium, any of the rare earth elements or any other dopant (also referred to as doping agent) that is suitable to provide or maintain ferroelectricity in hafnium oxide or zirconium oxide. The ferroelectric material may be doped at a concentration from about 2 mol % to about 6 mol %, only as an example.

According to various aspects, a capacitive memory structure may be or may include a ferroelectric capacitor (Fe-CAP) or an anti-ferroelectric capacitor (AFeCAP); or, in other aspects, a capacitive memory structure may include a ferroelectric capacitor or an anti-ferroelectric capacitor (AFeCAP), and one or more additional elements. According to various aspects, a capacitive memory structure may include a capacitive memory element, e.g., a ferroelectric layer, e.g., an anti-ferroelectric layer. Illustratively, a memory element of a memory structure may include any type of spontaneously-polarizable material, e.g., a ferroelectric material, an anti-ferroelectric material, an anti-ferroelectric-like material, etc. An information may be stored via at least two remanent polarization states of the capacitive memory structure. The programming of the capacitive memory structure (illustratively the storage of information therein) may be carried out by providing an electric field between the electrode layers to thereby set or change the remanent polarization state of the capacitive memory structure (illustratively, of the memory element). Illustratively, a spontaneous-polarizable material (e.g., a ferroelectric material, e.g. an anti-ferroelectric material) may be used to store data in non-volatile manner in integrated circuits.

In the semiconductor industry, the integration of non-volatile memory technologies may be useful for System-on-Chip (SoC) products like microcontrollers (MCU), etc. According to various aspects, a non-volatile memory may be integrated next to a processor core of a processor. As another example, one or more non-volatile memories may be used as part of a mass storage device. According to various aspects, a non-volatile field-effect transistor-based memory structure may store data for a period of time from hours (e.g. more than 5 hours) to several tens of years (e.g. 10 years, 20 years, etc.), whereas a volatile field-effect transistor-based memory structure or memory cell may store data for a period of time from nanoseconds to hours (e.g. less than 5 hours).

It may be understood that, even though various aspects refer to a memory element including or being made of a spontaneously-polarizable material, other memory elements whose state may be altered by an electric field provided across a capacitive memory structure may be used.

According to various aspects, a memory device may include one or more memory cells and a control circuit (also referred to herein as memory controller) to cause an operation on the one or more memory cells (e.g., a write operation and/or a readout operation). It is noted that some aspects are described herein with reference to a memory cell of a memory device; it is understood that a memory device may include a plurality of such described memory cells that can be operated in the same way by the memory controller, e.g., at the same time or in a time sequence. A memory device may further include respective sets of control lines and voltage supply levels configured to operate the one or more memory cells of the memory device.

As used herein, the term "voltage" may be used with respect to "a supply voltage", "an input voltage," "an output voltage," and the like, depending on the node. As an example, the term "supply voltage" may be used herein to denote a voltage provided to a circuit for operating the circuit components (e.g., for operating the logic components of a logic circuit). As another example, the "input voltage" may be the voltage level at an input node of circuit and the "output voltage" may be the voltage level at an output node of a circuit. The "voltage across" a component may be used herein to denote a voltage drop from a node on one side of a component (e.g., a gate of a transistor) to a node on the other side of the component (e.g., a source/drain of the transistor).

In some aspects, a memory device may be or may include a memory cell arrangement, e.g., an array including a plurality of memory cells. A memory device may be operated based on one or more write operations (e.g., program and/or erase operations) and/or one or more readout operations. During a write operation, as example, predefined voltages may be provided to electrical lines (also referred to as control-lines or driver-lines), wherein the electrical lines may be connected to the respective nodes of the memory cells to allow for the desired operation. The electrical lines may be referred to, for example, as word-lines, source-lines, and/or bit-lines. Various timings may be used to provide the respective voltages on the electrical lines, e.g., to provide the desired write voltages and/or the desired readout voltages. A write operation may be referred to herein as writing memory cells of a memory and a readout operation may be referred to herein as a read operation or as reading memory cells of a memory.

It is noted that a memory cell arrangement may usually be configured in a matrix-type arrangement, wherein columns and rows define the addressing of the memory cells according to the control lines connecting respectively subsets of memory cells of the memory cell arrangement along the rows and columns of the matrix-type arrangement. In general, a memory cell arrangement may include a plurality of (e.g., volatile or non-volatile) memory cells, which may be accessed individually or in sectors (blocks), depending on the layout of the memory cell arrangement and/or the corresponding addressing scheme. For example, in a field-effect transistor (FET) based memory cell arrangement, the memory cells may be arranged in a matrix architecture (A (m, n)) including columns, for example a number n of columns, and rows, for example a number m of rows, with n and m being integer numbers greater than one. In the matrix architecture, each memory cell may be connected to control-lines (e.g., to one word-line, to a bit-line, and to a source-line), which may be used to supply voltages to the memory cells for performing writing operations and readout operations. The matrix architecture may be, for example, referred to as "NOR" or "NAND" architecture, depending on the way neighboring memory cells are connected to each other, i.e. depending on the way the terminals of neighboring memory cells are shared, but are not limited to these two types (another type is for example an "AND" architecture). However, other arrangements may be suitable as well.

With particular respect to the disclosed bad sector marking system, remanent-polarizable memory element (e.g., a field-effect transistor-based memory element (e.g., a FeFET)) may be used within the row driver circuit for each sector of a memory arrangement, where the programmed state of the sector's memory element (also referred to as a "bad sector memory element") may indicate whether the sector has been marked as a bad or good. For example, if the memory element has been set to a first memory state (e.g., an n-type field-effect transistor that has been "programmed" to the LVT state), the sector may be understood as a bad sector and the row driver circuit may deselect the sector and indicate to the memory controller that the addressed sector is bad. Whereas if the sector's memory element has been set to a second memory state (e.g., an n-type field-effect transistor that has been "erased" to the HVT state), the sector may be understood as a good sector and the row driver circuit may select the sector as normal when addressed. Because such a memory element may be locally embedded in each sector's row driver circuit, there is no need for the memory controller to, each time the memory is powered-on, read out addresses of bad sectors, and scan the entire memory to program latches of those bad sectors. Instead, the good/bad status of the sector may be retained by the locally embedded memory element. Circuitry of the row driver may also be provided to selectively program/erase the memory element (e.g., program/erase a FeFET to the appropriate remanent polarization state (e.g., a first state (e.g., an LVT state) associated with a bad sector or a second state (e.g., a HVT state) associated with a good sector or), where control signals may be used to select between normal user operation (e.g., performing user-mode read or write operations on the memory cells of the addressed sector) and a programming operation (e.g., setting the state of the memory element to the programmed/erased state, depending on whether the sector is to be marked as good or bad).

For example, FIG. 1 shows a block diagram of a bad sector marking system 100 that may locally embed the bad sector marking directly in the row driver circuit 120 for the sector. The bad sector marking system 100 may use a bad sector memory element 130 (e.g., a remanent-polarizable memory element (e.g., a remanent polarizable field-effect transistor)) that is locally embedded in the row driver circuit 120 and used as a marker for whether the sector 110 is bad. Depending on the programming state of the bad sector memory element 130, the row driver circuit 120 may enable selection or deselection of the memory cells 190 of sector 110 (e.g., via the SECT_SEL line). The row driver circuit 120 may also pull down a common bad sector indicator line (e.g., BAD_COMMON) if the memory controller attempts to operate memory cells 190 when the bad sector memory element 130 has been marked to indicate sector 110 is bad. To operate, program, and utilize the locally embedded bad sector memory element 130, the row driver circuit 120 may generate and/or use internal logic signals using operating transistors/internal signaling 140 that may include appropriate transistors, inverters, logic gates, etc., that may be responsive to control signals 104 and address lines 108. For example, the control signals 104 may include one or more signals used to set the operating mode of the sector (e.g., whether to operate in a user mode for reading/writing memory cells 190, whether to set the state of the bad sector memory element 130 (e.g., mark the sector 110 as good or bad), etc.).

In addition, bad sector marking system 100 may include level shifter(s) 105 and/or level shifter(s) 150 that may be locally embedded in the sector 110 or shared among many sectors. The level shifter(s) 105, 150 may be used to ensure that sufficient voltage ranges are available for programming the bad sector memory element 130 to each of the programmed states (e.g., the programmed state representing a good sector and/or the programmed state representing the bad sector) and for operating the transistors or logic elements of the operating transistors/internal signaling 140. As discussed in more detail below, using level shifter(s) 105, 150 may allow the bad sector marking system 100 to operate within a range of logic levels used by the memory and/or memory controller for normally operating sector 110 in a user mode (e.g., during a read or write/erase operation on memory cells 190), while also allowing the bad sector marking system 100 to provide a sufficient range of voltages for programming/erasing the bad sector memory element 130 (e.g., negative shifting from a logic level range of zero to Vdd to a range between $V_{LOW}$ and Vdd), where the magnitude of the programming/erasing voltage range may exceed the magnitude of the voltage range of normal operation.

Figure 2:
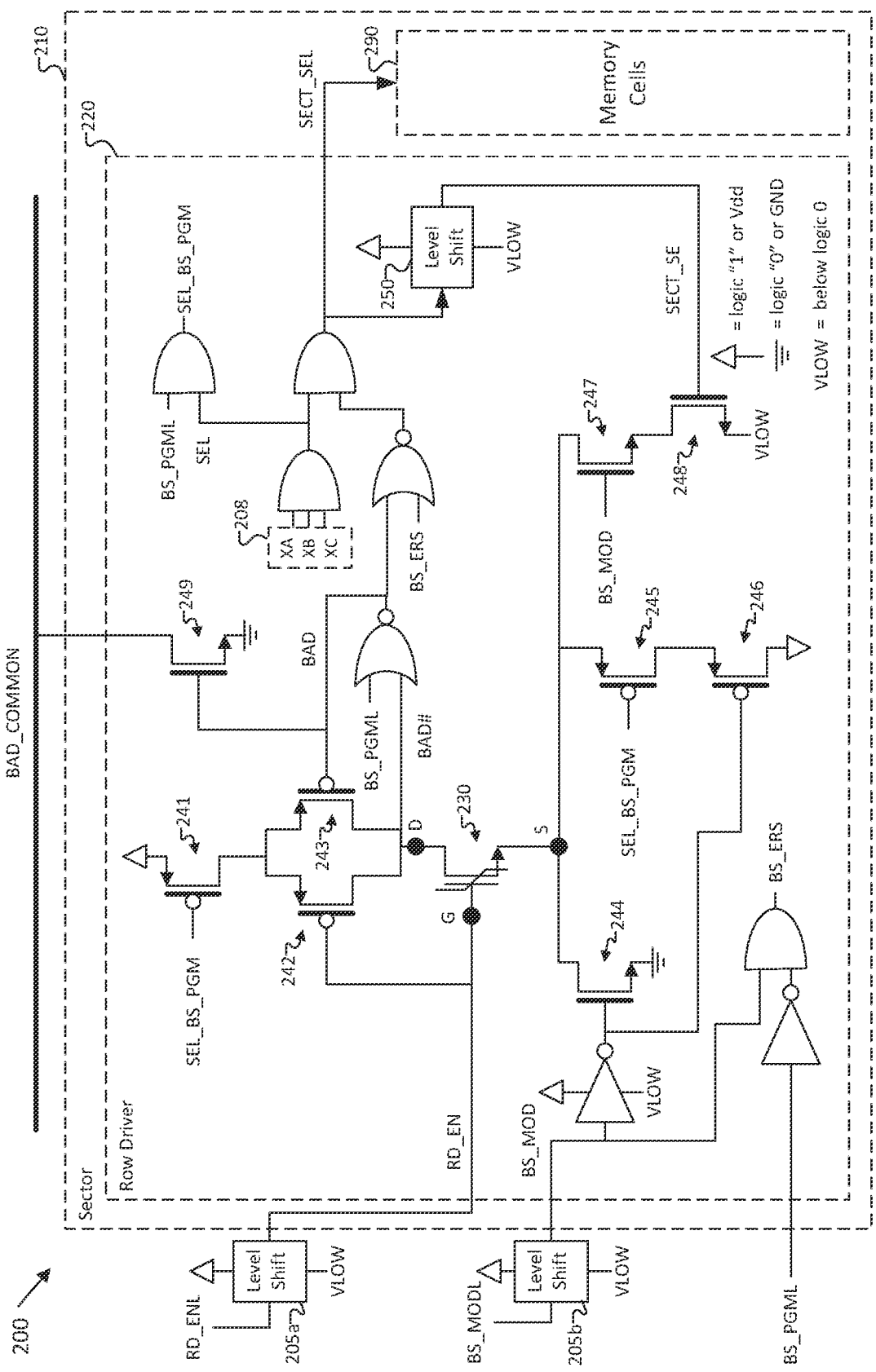
FIG. 2 shows an exemplary circuit diagram of a bad sector marking system that includes a state-programmable field-effect transistor in the driver circuit for the sector.

FIG. 2 shows a circuit diagram of a bad sector marking system 200 that may locally embed the bad sector marking directly in the row driver circuit for the sector. Bad sector marking system 200 may be an exemplary embodiment of the bad sector marking system 100 described above with respect to FIG. 1, and this example of FIG. 2 is not intended to limit bad sector marking system 100, which may be implemented in any number of ways. As should be appreciated, bad sector marking system 200 may be part of a memory arrangement, such as a non-volatile memory, with multiple sectors that may be similar to sector 210. As should also be appreciated, although the term "sector" has been used to describe a grouping of multiple memory cells (e.g., memory cells 290 have been grouped together as part of sector 210), this term should not be understood to limit the arrangement of memory cells or the accessing scheme used by the memory, and the disclosure should be understood to apply to other types of groupings (e.g., a single memory cell, memory cells grouped in "sectors," memory cells grouped in "blocks," memory cells grouped in "pages," etc.), for all types of memory layouts and addressing schemes.

The bad sector marking system 200 may use a bad sector memory element 230 that is locally embedded in the row driver circuit 220 and used as a marker for whether the sector 210 is bad. Depending on the programming state of the bad sector memory element 230, the row driver circuit 220 may enable selection or deselection of the memory cells 290 of sector 210 (e.g., via the SECT_SEL line). The row driver circuit 220 may also pull down a bad sector indicator line that may be common to multiple sectors (e.g., BAD_COMMON) if the memory controller attempts to read/write memory cells 290 where the bad sector memory element 230 has been marked to indicate sector 210 is bad.

To operate, program, and utilize the locally embedded bad sector memory element 230, the row driver circuit 220 may use and generate internal logic signals using appropriate transistors, inverters, logic gates, etc., that may be responsive to control signals (e.g., an enable line (RD_ENL) that selects the sector for operation (e.g., a row decoder enable line), a bad sector mode line (BS_MODL), and/or a bad sector program line (BS_PGML)) and address lines 208 that may be provided from a memory controller of the memory to which sector 210 belongs. For example, the control signals may include one or more signals used to set the operating mode of the sector (e.g., through BS_MODL and/or BS_PGML signals that may indicate whether to operate the sector 210 in a user mode for reading/writing memory cells 290 or whether to set the state of the bad sector memory element 230 (e.g., mark the sector 210 as good or bad), etc.). As should be appreciated, while a three bit addressing scheme is shown for address lines 208 (e.g., lines XA, XB, and XC), the address lines 208 may be any number of bits, depending on how the memory arranges/groups the memory cells and the smallest erasable and/or addressable grouping of memory cells.

In the particular example of FIG. 2, the bad sector memory element 230 may be a remanent polarizable field-effect transistor (e.g., a FeFET) with a gate and source/drain terminals. While an n-type field-effect transistor is shown, it should be appreciated that a p-type field-effect transistor may also be used with appropriately corresponding changes to the operational transistors, logic, and programming states. Similarly, while the nodes of bad sector memory element 230 (also referred to FeFET 230) have been labeled for convenience with a label for the gate ("G") and labels for the source/drain ("S", "D" respectively), it should be appreciated that these are not to be limiting and in any event, may depend on the type of FET (e.g., n-type or p-type). Irrespective of the labels, as discussed above with respect to remanent polarizable memory elements, the bad sector memory element 230 may be remanently polarizable to at least two different programming sates as a function of voltage across the field effect transistor (e.g. between the gate and source or between gate and drain). In the particular example of an n-type FeFET, bad sector memory element 230 may be set to an HVT state (e.g., "erased") or an LVT state (e.g., "programmed"). Whether the FeFET is conducting (e.g., in an on state or in an off state) may depending on weather the FeFET is in the HVT state or the LVT state. As discussed above, for an n-FET the HVT state may be associated with a lower current flow than the LVT state, where the LVT state may be an electrically conducting state (e.g., associated with a logic memory state "1", also referred to as a first memory state, first programming state, or programmed state) and the HVT state may be an electrically non-conducting state or at least less conducting than the low threshold voltage state (e.g., associated with a logic memory state "0", also referred to as a second memory state, second programming state, or erased state). In this manner, the memory state of the bad sector memory element 230 may determine whether the voltage level at one node (e.g., one of the drain/source) of the bad sector memory element 230 is conducted to the other node (e.g., the other of the drain/source).

In addition, bad sector marking system 200 may include level shifter(s) 205a, 205b, and/or 250, that may be locally embedded in the sector 210 or shared among many sectors of the memory. The level shifter(s) 205a, 205b, and/or 250 may be used to ensure that sufficient voltage ranges are available for programming the bad sector memory element 230 to each of the programmed states (e.g., the programmed state representing a good sector and/or the programmed state representing the bad sector) and for operating the transistors and/or logic elements of the row driver 220. While the memory/memory controller, of which sector 210 may be a part, may generally use common logic levels (e.g., zero volts representing logic 0 and Vdd volts representing logic 1) for control signals and logic circuitry, some transistors and logic elements may need to operate at different voltage levels in order to, for example, provide sufficient voltage ranges to program/erase the bad sector memory element 230, which may have a larger voltage range than those of the common logic levels. In this manner, sufficient transistors/logic gates may be used to ensure that the correct voltage levels are applied to the nodes of the bad sector memory element 230 to prevent programming during normal user mode operation but which are sufficient to program/erase the bad sector memory element 230 during a programming operation, which may exceed the voltage range of normal user mode operation. As will be apparent from the examples discussed below, level shifter(s) 205a, 205b, and/or 250 may be used to provide this voltage range necessary for programming/erasing the bad sector memory element 130.

For the example shown in FIG. 2, logic "1" (e.g., Vdd) is denoted by "1" or the symbol ↑, , whereas logic "0" (e.g., zero volts or ground) is denoted by "0", the symbol ╤, =, or "GND." As should be appreciated, other voltages may be used for different logic levels, and the supply voltages of the corresponding transistors/logic elements may be adjusted accordingly. Similarly, the bad sector memory element 230 may be programmable to different programming states based on the voltage across it (e.g., from gate to source/drain). Thus, the level shifter(s) 205a, 205b, and/or 250 and other voltages may be selected such that there may be a sufficient voltage drop across the bad sector memory element 230 when it is to be programmed (e.g., when the bad sector marking system 200 resets sector 230 as good or marks it as bad). For example, if the logic voltage is Vdd, the magnitude of the programming voltages may be much higher, e.g., $$\frac{3}{2}Vdd,$$

such that the voltage across the bad sector memory element 230 during normal operation does not approach the programming voltage for bad sector memory element 230. In the examples discussed below, bad sector memory element 230 may be programmed to a first programming state (e.g., by applying a voltage of $$-\frac{3}{2}Vdd$$

across it to "erase" the FeFET 230 to the HVT state) or a second programming state (e.g., by applying a $$\frac{3}{2}Vdd$$

across it to "program" the FeFET 230 to the LVT state). As should be appreciated, however, the bad sector memory element 230 may be designed to set its remanent states using other ranges for programming voltages, where the corresponding logic levels, control signals, and voltage shifting may be adjusted accordingly.

FIGS. 3 through 8 provide annotated versions of the schematic in FIG. 2, showing how bad sector marking system 200 may respond in various scenarios, depending on the selected mode of operation and whether the bad sector memory element 230 is marked good/bad or is to be marked as good/bad. For this purpose, reference is made to Table 1 that shows various control signals that may be used to set the operating mode of sector 210:

TABLE 1

| BS_MODL (Mode?) | BS_PGML (Program?) | XA, AB, AND AC (Sector Addressed?) | Operation |
| --- | --- | --- | --- |
| 0 | x | x | User Mode |
| 1 | 0 | x | Erase Memory Element in all sectors |
| 1 | 1 | 0 | Program Memory Element - Inhibit |
| 1 | 1 | 1 | Program Memory Element - Program |

The control signals may be received from the memory controller and may be a combination of control lines for setting whether sector 210 is configured for user operation or whether sector 210 is configured for programming the bad sector memory element 230 (e.g., to mark sector 210 as good/bad). The control signals may be common to multiple sectors (e.g., where multiple sectors of the memory receive the same control signals), or they may be unique to the sector (e.g., for addressing an individual sector). In Table 1 and the examples that follow, two common, logic-level-based control lines are used (e.g., BS_MODL to indicate whether the memory is operating in "user mode" (BS_MODL=0) or "bad sector memory element programming mode" (BS_MODL=1) and BS_PGML that indicates to which programming state the bad sector memory element 230 is to be programmed (e.g., if BS_PGML=0, then "erase" bad sector memory element 230 to the HVT state; or if BS_PGML=1, then "program" bad sector memory element 230 to the LVT state). As should be appreciated, this signaling scheme is merely exemplary and any type of control logic and any number of control lines may be used to configure the operating mode and programming state of the bad sector memory element.

In addition to indicating the operation mode, the control signals may also include addressing signals may be received that indicate whether a given sector has been addressed (e.g., via address lines 208) for the given operation (e.g., for a read/write operation on memory cells 290 and/or for a programming operation to program bad sector memory element 230). As should be appreciated, while a three bit addressing scheme is shown for address lines 208 (e.g., lines XA, XB, and XC), the address lines 208 may be any number of bits, depending on how the memory arranges/groups the memory cells and the smallest erasable and/or addressable grouping of memory cells (e.g., cell, sector, page, etc.). In addition to operating mode and addressing signals, a control signal may also be received at sector 210 for enabling the sector (e.g., via a RD_ENL control line), where the memory controller my set the RD_ENL control signal to a logic high state to enable the sector. For example, if sector 210 is addressed (e.g., the sector's address lines 208 are set to logic high) and the operation mode is set to user mode, sector 210 may select memory cells 290 for reading or writing when RD_ENL goes high.

Figure 3:
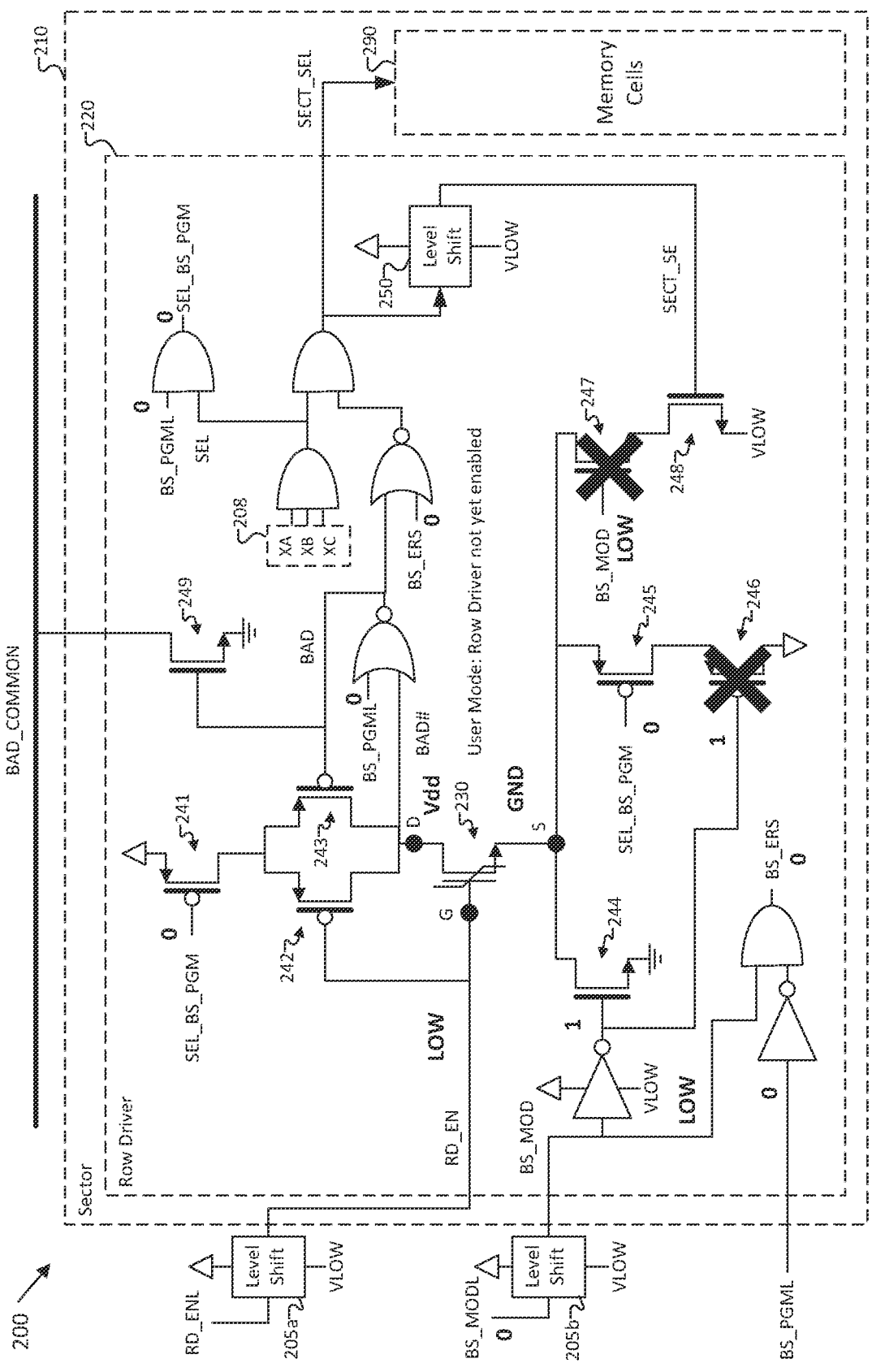
FIGS. 3-8 show annotations to the exemplary circuit diagram of FIG. 2, which represent various exemplary operating scenarios of the bad sector marking system.
Figure 4:
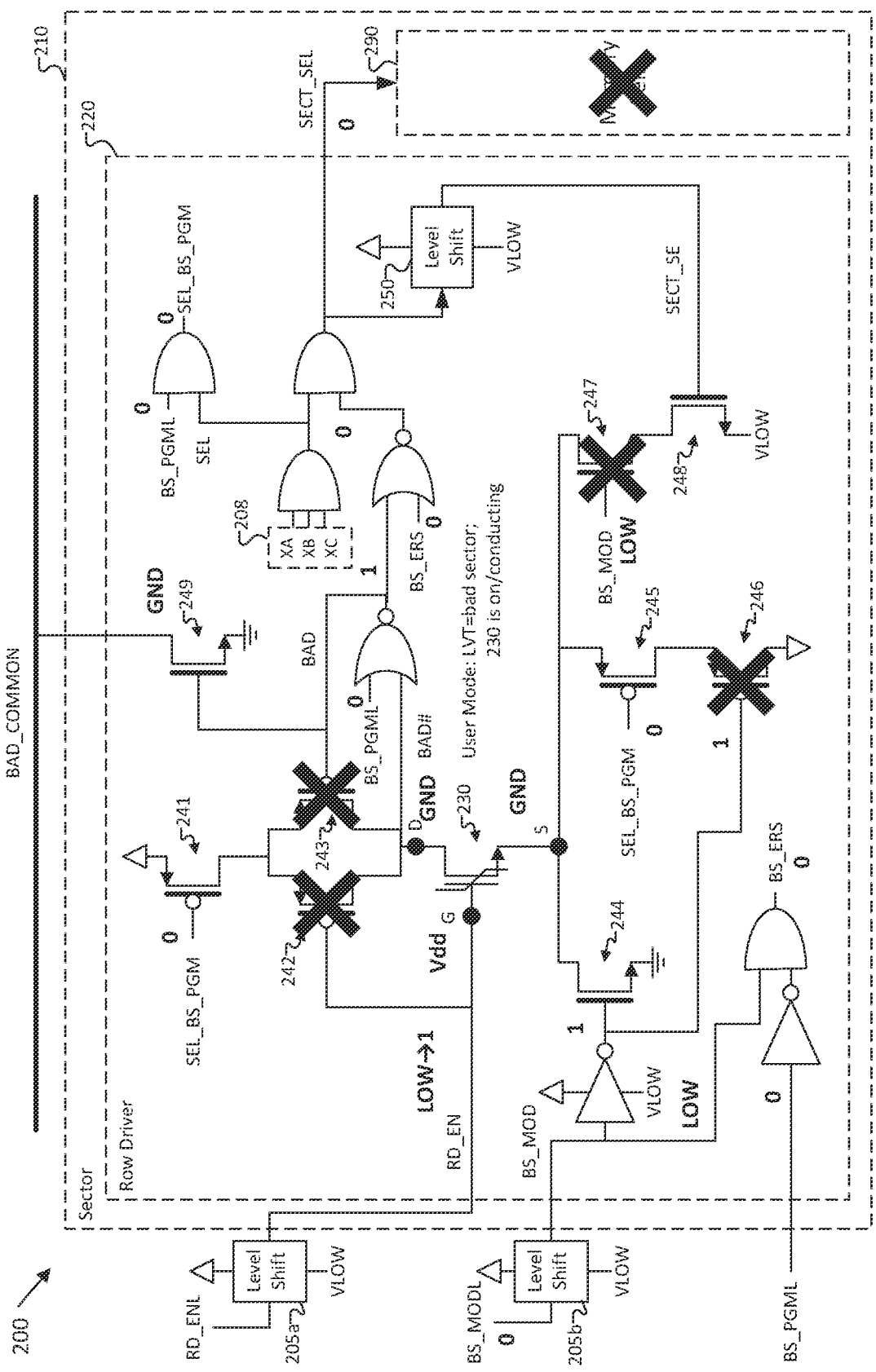
Figure 5:
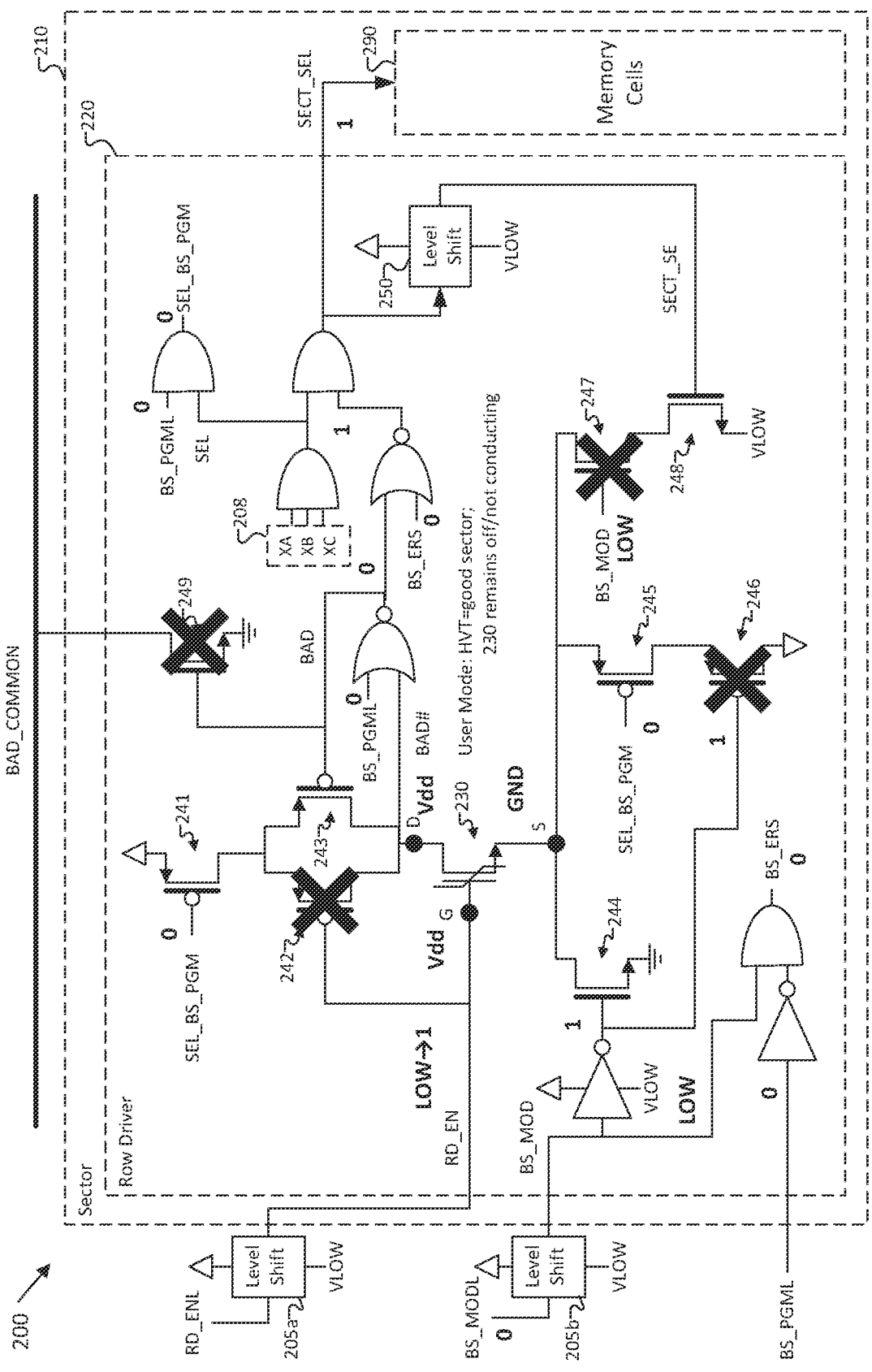

As one particular example, FIG. 3 shows how various control signals and internal transistors/logic of sector 210 may be operated in user mode. To operate in user mode, the memory may set BS_MODL to logic low (BS_MODL=0). Based on this control signal, internal logic may set the voltage on one or more nodes of the bad sector memory element 230. For example, as a result of BS_MODL, transistor 244 may be switched on such that the source/drain node S of bad sector memory element 230 is connected to GND supplied by transistor 244. At the same time, transistors 246 and 248 are switched off to disconnect other available voltages, namely Vdd (provided if transistor 246 were switched on) and LOW volts (provided if transistor 248 were switched on). Whether the bad sector memory element 230 is switched on (and therefore conducts GND to the source/drain node D) or switched off (and not conducting GND to the source/drain node D) may depend on the programmed state of the bad sector memory element 230 and may also depend on the logic state of the RD_ENL signal (e.g. whether the row driver is enabled). As shown in FIG. 3, the driver circuit is not enabled, so RD_ENL is a logic value low, so RD_EN is LOW and transistor 230 is switched off. FIGS. 4 and 5 show different user mode scenarios where the row driver is enabled (e.g., when RD_ENL moves from a logic value low to logic value high such that RD_EN is at Vdd), and where the memory state of the bad sector memory element 230 may impact the operation of row driver circuit 220.

If the bad sector memory element 230 has been programmed to the HVT state (e.g., indicating a good sector), the bad sector memory element 230 will be switched off so that GND is not conducted to node D. When the bad sector memory element 230 has been programmed to the LVT state (e.g., indicating a bad sector), the bad sector memory element 230 will be switched on and therefore conducting GND to node D. If the bad sector memory element 230 is switched on and conducting GND to node D, this will set an internal BAD signal to logic high, which will switch off transistor 243 and switch on transistor 249 to pull down common bad sector indicator line (e.g., BAD_COMMON). As should be appreciated, transistor 243 may have a weaker driving capability than bad sector memory element 230 so that bad sector memory element 230 may be strong enough to pull node D to GND (e.g., when in user mode operation and RD_ENL changes from the logic value low (e.g., the row driver is not enabled) to the logic value high (e.g. the row driver gets enabled)). In addition, the memory cells 290 will be disabled for a read/write operation on memory cells 290 by disabling, through internal logic, the sector selection signal (e.g., setting SECT_SEL to logic low or LOW). This particular case (e.g., the memory operating in user mode where the bad sector memory element 230 has been programmed to the LVT state) is shown more clearly in FIG. 4.

On the other hand, if the bad sector memory element 230 is switched off and not conducting GND to node D, transistor 243 will remain on when RD_ENL changes from the logic value low to the logic value high, conducting Vdd to node D, and the internal BAD signal will be kept to logic low so that transistor 249 does not pull down the common bad sector indicator line (e.g., BAD_COMMON). In addition, the memory cells 290 will be enabled for the user mode operation by enabling, through internal logic, the sector selection signal (e.g., setting SECT_SEL to logic high or Vdd). This particular case (e.g., the memory operating in user mode where the bad sector memory element 230 has been programmed to the HVT state) is shown more clearly in FIG. 5.

Importantly, when the mode of operation has been set to user mode, the magnitude of the voltage across bad sector memory element 230 does not exceed the programming voltage necessary (e.g., ½ Vdd) to change the remanent polarization state (e.g., to "program" or "erase" the memory state) of the bad sector memory element 230. This is in contrast to when the mode of operation is in programming mode, where, in order to mark sector 210 as good or bad, the bad sector memory element 230 is programmed to the corresponding programming state (e.g., "erased" to the HVT state to mark the sector as good or "programmed" to the LVT state to mark the sector as bad). To set the mode of operation to the programming mode, the memory may set BS_MODL to logic high (BS_MODL=1). Based on this control signal, internal logic may set the voltage on one or more nodes of the bad sector memory element 230. For example, as a result of BS_MODL being set high, transistor 244 may be switched off whereas one of transistors 246 and 247 are switched on to conduct a voltage level, namely Vdd (if transistor 246 is switched on) or LOW volts (if transistor 248 is switched on), used for programming the bad sector memory element 230 to the desired programming state. Whether transistor 246 or transistor 247 is switched on may depend on other control signals that indicate the desired programming state. For example, the BS_PGML signal may indicate the desired programming state, where if BS_PGML is logic low, the bad sector memory element 230 is to be "erased" to the HVT state, whereas if BS_PGML is logic high, the bad sector memory element 230 is to be "programmed" to the LVT state. Internal transistors and logic elements may then be used in combination with the control signals and address signals to set the voltages at the nodes of the bad sector memory element 230 so that the voltage across it is sufficient to program it to the desired programming state (e.g.

$$\frac{3}{2}Vdd$$

from gate to source/drain to "program" the bad sector memory element 230 to the LVT state or $$-\frac{3}{2}Vdd$$

from gate to source/drain to "erase" it to the HVT state).

Figure 6:
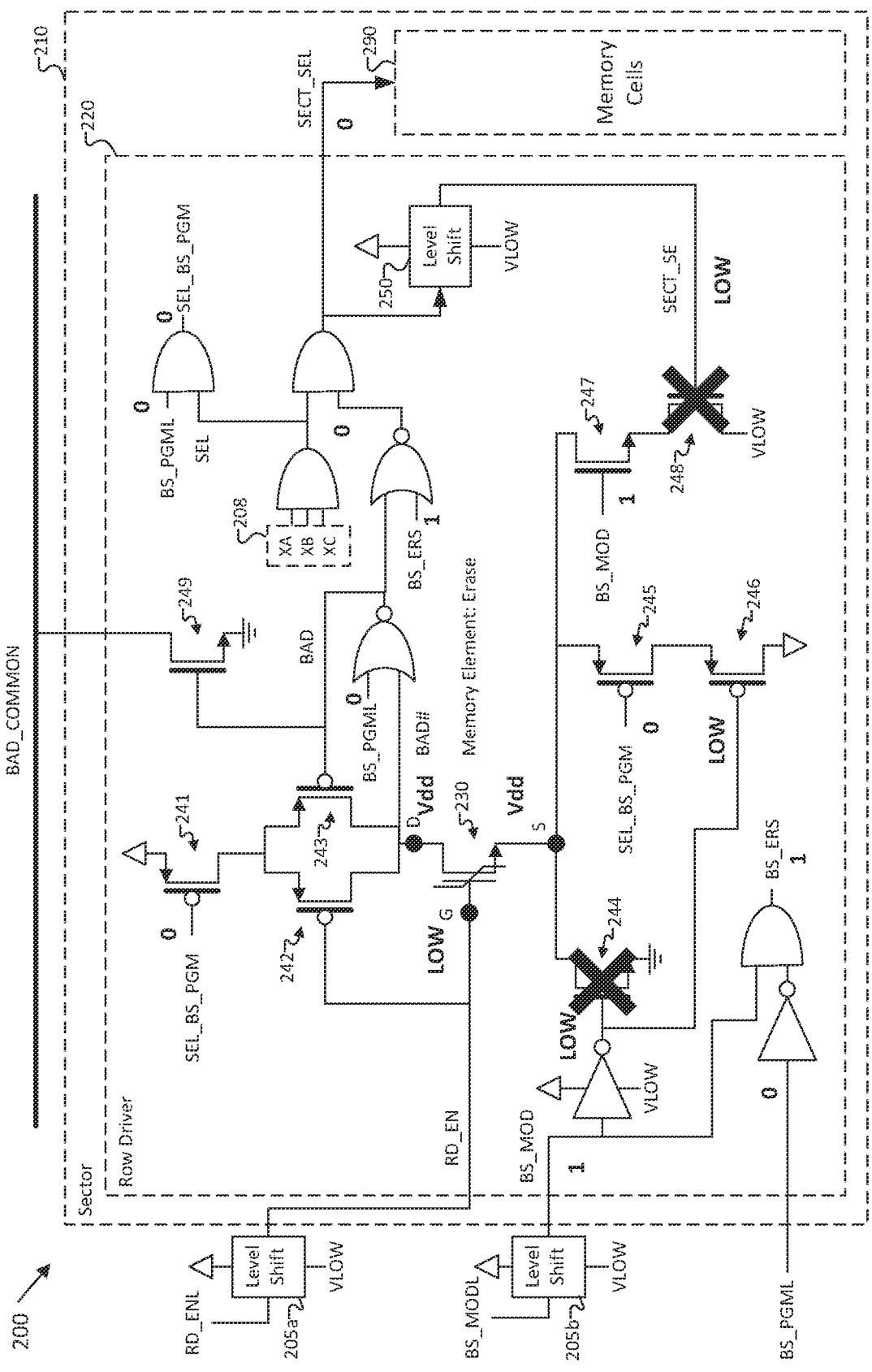
Figure 7:
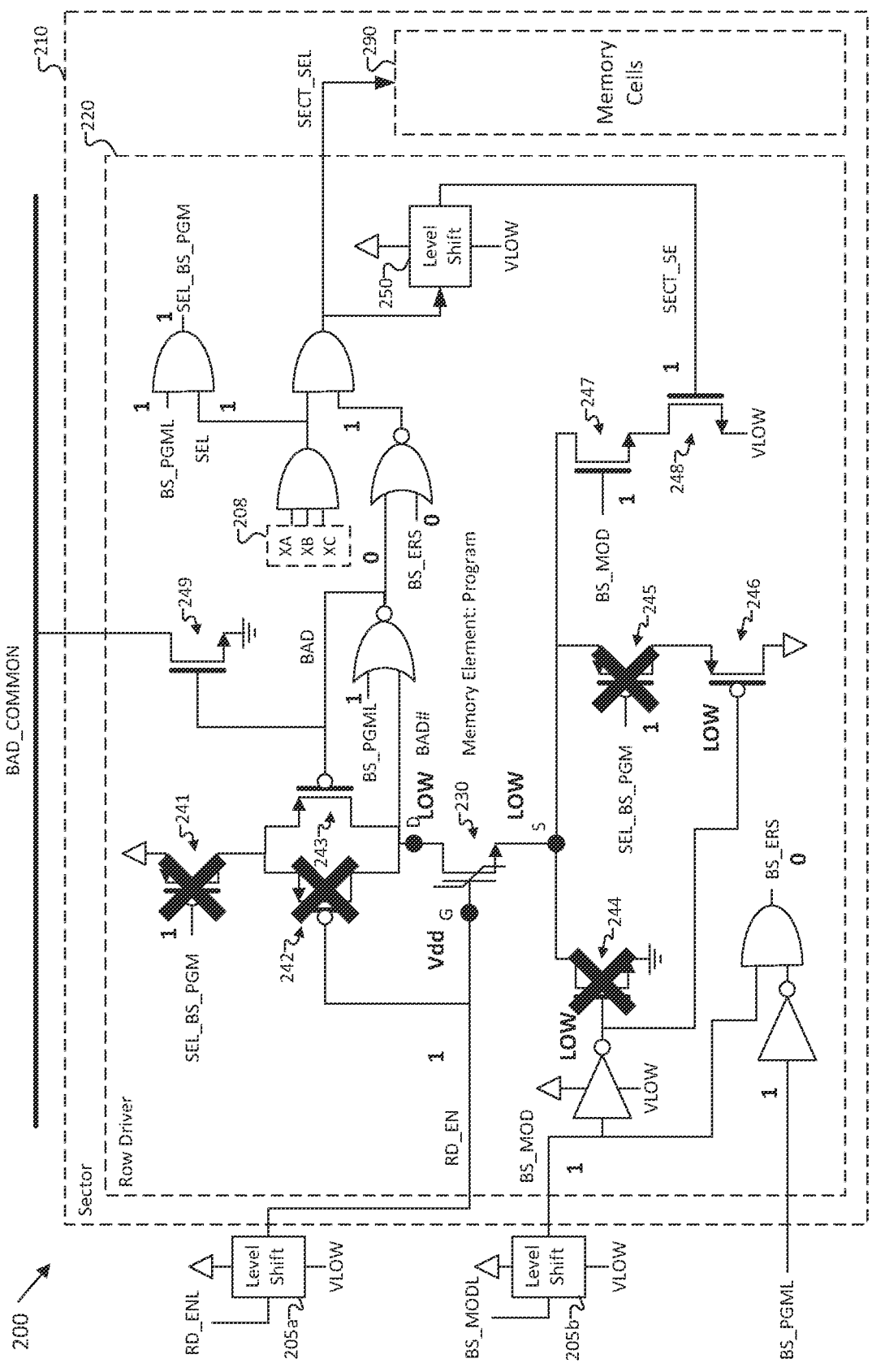
Figure 8:
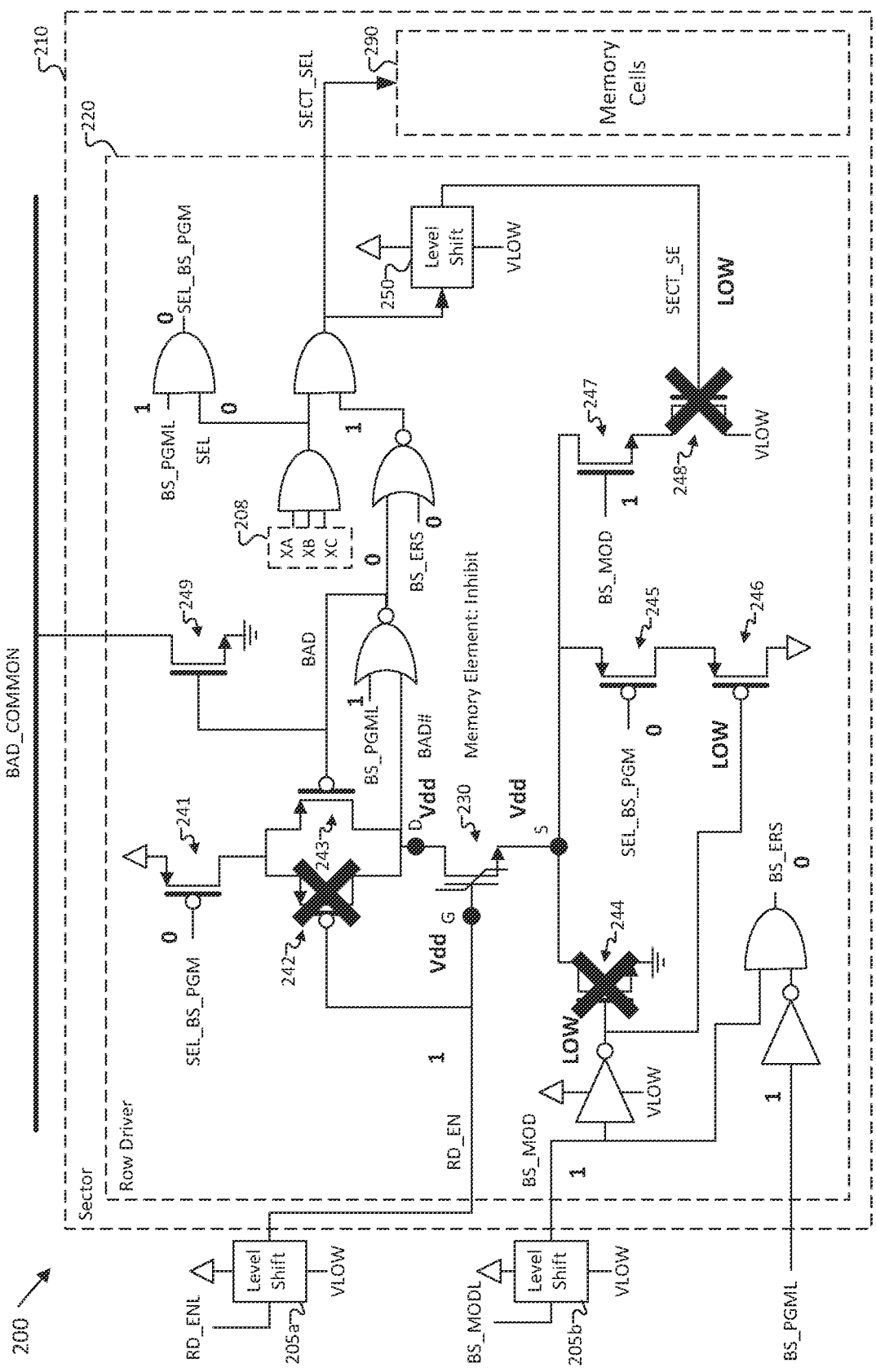

Three different programming scenarios are depicted in FIGS. 6-8 for when the memory is operating in programming mode (BS_MODL=1). As shown in FIG. 6, for example, the memory has set BS_PGML to logic low in order to reset all sectors as "good" sectors by "erasing" the embedded memory element of each sector. As shown with respect to sector 210, bad sector marking system 200 may use internal transistors and logic elements in combination with provided control signals to set the voltages at the nodes of the bad sector memory element 230 so that the voltage across it is sufficient to program it to the HVT state (e.g.

$$-\frac{3}{2}Vdd$$

from gate to source/drain to "erase" it to the HVT state). In this case, RD_ENL) has been set to logic low, which provides a LOW voltage (e.g., $$-\frac{1}{2}Vdd)$$

to the gate node (G) of the bad sector memory element 230. At the same time, bad sector marking system 200 has configured internal logic signals to provide Vdd to the source/drain nodes (S, D) of the bad sector memory element 230. The logic low signal from RD_ENL causes transistor 242 to switch on and the logic low signal from BS_PGML causes transistor 241 to switch on (e.g., via internal signal SEL_BS_PGML) to conduct Vdd to the source/drain node D. The logic high signal from BS_MODL causes transistor 246 to switch on, thereby conducting Vdd to the source/drain node S of bad sector memory element 230 (through transistor 245 that has also been switch on (e.g., via internal signal SEL_BS_PGML)). At the same time, the logic high signal from BS_MODL causes transistor 244 to switch off while other internal logic (e.g., over SECT_SE) causes transistor 248 to be switched off to disconnect other available voltages, namely GND (provided if transistor 244 were switched on) and LOW volts (provided if transistor 248 were switched on). Together, providing these voltages means that the voltage across the bad sector memory element 230 is sufficient to "erase" it to the HVT state.

As shown in FIG. 6, the bad sector marking system 200 may be configured to erase sector 210, irrespective of whether sector 210 has been addressed (e.g., by enabling address lines 208). This allows the memory to simultaneously mark all of the sectors as "good" sectors (e.g., by program each bad sector memory element of each sector), rather than having to address each sector individually. This may be advantageous when provisioning the memory as part of the manufacturing process, where all sectors of the memory may be initialized to "good" by collectively "erasing" the bad sector memory elements for multiple sectors (e.g., all sectors) and thereafter, mark each bad sector as "bad" by individually "programming" the bad sector memory element of each addressed bad sector. As should be appreciated, however, bad sector marking system 200 may also be configured to erase sector 210 individually by making the voltages at the nodes of the bad sector memory element 230 dependent on whether the address lines 208 are enabled.

FIGS. 7 and 8 show how sector 210 may be marked as "bad" where the memory is configured to operate in the programming mode. For example, the memory may set BS_PGML to logic high in order to mark an addressed sector as "bad" by "programming" the locally embedded bad memory element. As shown with respect to sector 210, internal transistors and logic elements may be used in combination with provided control signals to set the voltages at the nodes of the bad sector memory element 230 so that the voltage across it is sufficient to program it to the LVT state (e.g.

$$+\frac{3}{2}Vdd$$

from gate to source/drain to "program" it to the LVT state). In this case, RD_ENL has been set to logic high, which provides Vdd to the gate node (G) of the bad sector memory element 230. At the same time, bad sector marking system 200 has configured internal logic signals to provide a LOW voltage to the source/drain nodes (S, D) of the bad sector memory element 230. The logic high signal from BS_MODL causes transistor 247 to switch on, thereby conducting LOW volts to the source/drain node S of bad sector memory element 230 from transistor 248 that is switched on (e.g., via internal signal SECT_SE) if the addressing lines 208 indicate that sector 210 has been selected for programming. At the same time, the logic high signal from BS_MODL causes transistor 244 to switch off, and other internal logic (e.g., over SEL_BS_PGML) causes transistor 245 to be switched off to disconnect other available voltages, namely GND (provided if transistor 244 were switched on) and Vdd (provided if transistor 245 were switched on). Together, providing these voltages means that the voltage across the bad sector memory element 230 is sufficient to "program" it to the LVT state if the addressing lines 208 indicate that sector 210 has been selected for programming.

If the addressing lines 208 indicate that the sector 210 has not been selected for programming, the bad sector marking system 200 may inhibit programming of the bad sector memory element 230 during a programming mode by ensuring that the magnitude of voltage across the bad sector memory element 230 does not exceed the programming voltage. This example is shown in FIG. 8, where if the address lines 208 have not selected sector 210 (e.g., at least one of XA, XB, and XC are low) this causes transistor 248 to switch off (e.g., via the SECT_SE line) and causes transistor 245 to switch on (e.g., via the internal SEL_BS_PGML line). This means that transistor 245 provides Vdd (conducted through transistor 246 that is switched on due to BS_MODL being high) to the source/drain node S of bad sector memory element 230. In this case, if the addressing lines 208 indicate that sector 210 has not been selected for programming, the voltage across the bad sector memory element 230 is not sufficient to program the bad sector memory element 230. In this manner, the bad sector marking system 200 may individually mark sectors as "bad"

only when the sector has been addressed, and may inhibit marking those sectors as "bad" that have not been addressed during a programming mode.

As should be appreciated, although the bulk connection of the bad sector memory element 230 (e.g., FeFET 230) is not shown in the examples of FIGS. 2-8, the bulk may be connected to the FeFET source (e.g., as an isolated FeFET) or connected to a common bulk shared with all n-type FETs in a common well, biased at the LOW voltage ($V_{LOW}$). This may be helpful if the FeFET has short channel length, so that the source/drain regions are shorted when VD=VS=Vdd and Vbulk=$V_{LOW}$. In such a case, the potential of the channel is Vdd, even if the bulk is $V_{LOW}$, ensuring proper voltage levels to inhibit programming of the FeFET (e.g., FeFET 230) when the sector is not addressed during programming (e.g., FIG. 8) or to erase the FeFET (e.g., FIG. 6), depending on the gate voltage. In addition or as an alternative to the bulk connection, as should also be appreciated, the voltage for $V_{LOW}$ may be set to GND when operating in user mode, which will limit the available voltage levels and inhibit programming of the bad sector memory element 230 (e.g., FeFET 230) during normal user operation.

As noted earlier, and as shown in the examples of FIGS. 2-8, the bad sector marking system 200 may include level shifter(s) 205a, 205b, and/or 250 to translate voltages from a logic voltage level to a lower voltage level (e.g., $V_{LOW}$ (also called LOW)) that may assist to provide sufficient voltage ranges for programming the bad sector memory element 230 to each of the programmed states (e.g., $$\frac{3}{2}Vdd$$

to "program" FeFET 230 to the LVT state or $$-\frac{3}{2}Vdd$$

to "erase" the FeFET 230 to the HVT state). For example, RD_ENL may be provided from the memory/memory controller that operates at normal logic levels (e.g., a logic low of 0 volts and a logic high of Vdd volts). The level shifter 205a may be used to adjust RD_ENL so that it provides internal voltage levels within the row driver 220 (e.g., noted as RD_EN) that may be necessary for programming the bad sector memory element 230. Thus, if RD_ENL is configured to operate between a logic low of 0 volts and a logic high of Vdd volts, the level shifter 205a may shift the voltage range for RD_EN to have a logic low of LOW volts (e.g.,)

$$-\frac{1}{2}Vdd\Big)$$

and a logic high or Vdd volts, such that the voltage provided to the gate node (G) of the bad sector memory element 230 may be sufficient to cause a voltage drop across the bad sector memory element 230 that it meets or exceeds the magnitude of the programming voltage $$\Big(\frac{3}{2}Vdd\Big)$$

when operating in programming mode.

As another example, BS_MODL may be provided from the memory/memory controller that operates at normal logic levels (e.g., a logic low of 0 volts and a logic high of Vdd volts). The level shifter 205b may be used to adjust BS_MODL so that it provides voltage levels within the row driver 220 (e.g., as BS_MOD) that may be necessary for programming the bad sector memory element 230. Thus, if BS_MODL is configured to operate between a logic low of 0 volts and a logic high of Vdd volts, the level shifter 205b may shift the voltage range for BS_MOD to have a logic low of LOW volts (e.g., $$-\frac{1}{2}Vdd\Big)$$

and a logic high of Vdd volts, such that the shifted voltage(s) may operate transistors/logic elements that may conduct voltage levels that are sufficient to cause a voltage drop across the bad sector memory element 230 that meets or exceeds the magnitude of the programming voltage $$\Big(\frac{3}{2}Vdd\Big)$$

when operating in programming mode. For example, BS_MOD may operate the gate of transistor 247 between logic low of LOW volts (e.g., $$-\frac{1}{2}Vdd\Big)$$

and a logic high of Vdd volts, so that it may be switched on to conduct to the bad sector memory element 230 the LOW voltage level that may be provided to it when transistor 248 is switched on.

Similarly, a level shifter 250 may be used to adjust SECT_SEL so that it provides voltage levels within the row driver 220 (e.g., as SECT_SE) that may be necessary for programming the bad sector memory element 230. Thus, if SECT_SEL is configured to operate between a logic low of 0 volts and a logic high of Vdd volts, the level shifter 250 may shift the voltage range for SECT_SE to have a logic low of LOW volts (e.g., $$-\frac{1}{2}Vdd\Big)$$

and a logic high of Vdd volts, such that the shifted voltage(s) may operate transistors/logic elements that may conduct voltage levels that are sufficient to cause a voltage drop across the bad sector memory element 230 that meets or exceeds the magnitude of the programming voltage $$\Big(\frac{3}{2}Vdd\Big)$$

when operating in programming mode. For example, SECT_SE may operate the gate of transistor 248 between logic low of LOW volts (e.g., $$-\frac{1}{2}Vdd\bigg)$$

and a logic high of Vdd volts, so that it may be switched on to conduct a LOW voltage level to the bad sector memory element 230 (e.g., via transistor 247). As should be appreciated, depending on whether the transistors/logic elements utilize level shifted signals or normal logic level signals, the corresponding bias voltages may be adjusted accordingly.

Figure 9:
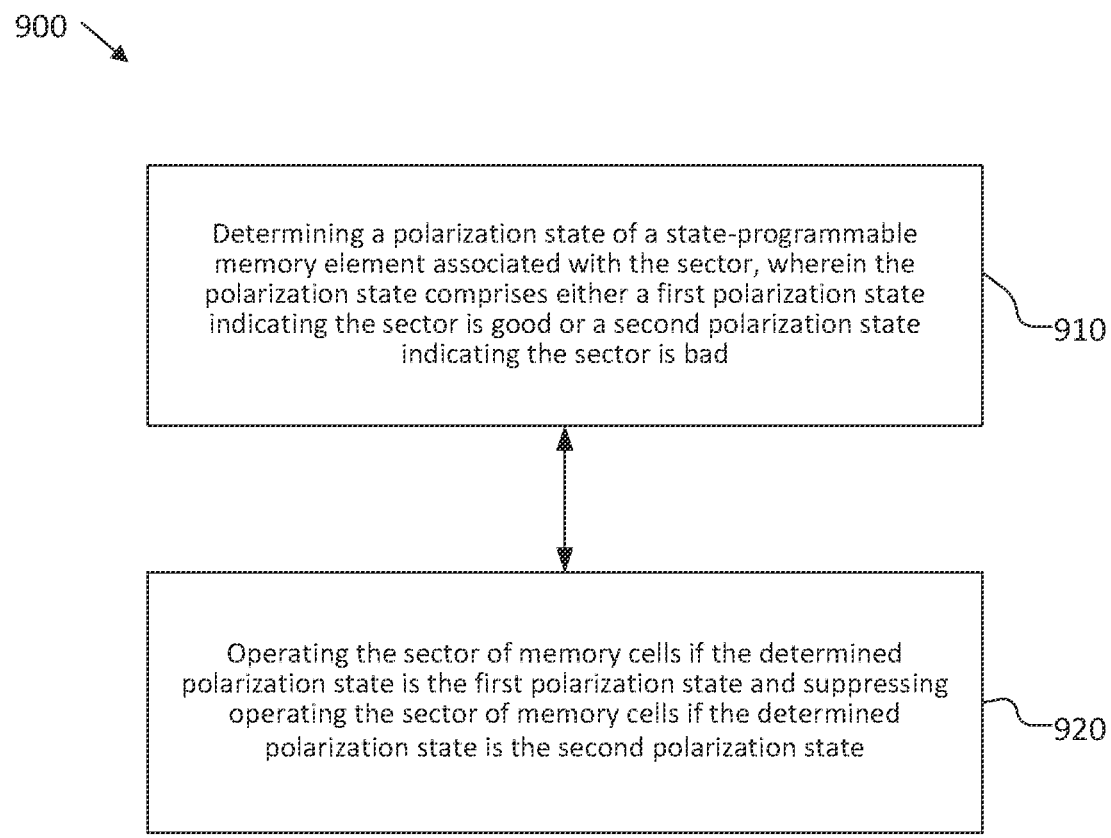
FIG. 9 depicts an exemplary schematic flow diagram of a method for operating a sector of memory cells based on a state-programmable memory element that indicates a bad sector marking.

FIG. 9 depicts an exemplary schematic flow diagram of a method 900 for reading or writing (generally, accessing) a sector of memory cells based on a state-programmable memory element that indicates a bad sector marking. Method 900 may implement any of the features and/or structures described above with respect to bad sector marking systems 100, 200 and/or FIGS. 1-8.

Method 900 includes, in 910, determining a polarization state of a state-programmable memory element associated with the sector, wherein the polarization state comprises either a first polarization state indicating the sector is good or a second polarization state indicating the sector is bad. Method 900 also includes, in 920, operating the sector of memory cells if the determined polarization state is the first polarization state and suppressing operating the sector of memory cells if the determined polarization state is the second polarization state.

In the following, various examples are provided that may include one or more aspects described above with reference to bad sector marking systems 100, 200 and/or FIGS. 1-8. It may be intended that aspects described in relation to the circuits may apply also to the described method(s), and vice versa.

Example 1 is a memory arrangement including a group of memory cells and a driver circuit for operating the group of memory cells, wherein the driver circuit includes a remanent-polarizable memory element. The driver circuit is configured to enable or disable an operation of the group of memory cells based on a memory state of the remanent-polarizable memory element.

Example 2 is the memory arrangement of example 1, wherein the group of memory cells includes a sector or a plurality of sectors of the memory arrangement.

Example 3 is the memory arrangement of either of examples 1 or 2, wherein the driver circuit includes a row driver for a sector of memory cells, wherein the group of memory cells includes the sector of memory cells.

Example 4 is the memory arrangement of any one of examples 1 to 3, wherein the remanent-polarizable memory element includes a remanent-polarizable field-effect transistor.

Example 5 is the memory arrangement of any one of examples 1 to 4, wherein the driver circuit is configured to enable or disable an output signal of the driver circuit based on a control input signal.

Example 6 is the memory arrangement of example 5, wherein the control input signal includes an address input signal representing whether the group of memory cells is a selected group of memory cells for the operation.

Example 7 is the memory arrangement of any one of examples 1 to 6, wherein the operation includes a read operation and/or a write operation on the group of memory cells.

Example 8 is the memory arrangement of any one of examples 1 to 7, wherein the driver circuit further includes operating transistors configured to set the memory state of the remanent-polarizable memory element.

Example 9 is the memory arrangement of example 8, wherein at least one of the operating transistors is configured to receive an output signal from the driver circuit to set the memory state of the remanent-polarizable memory element based on a control input signal to the driver circuit, wherein the driver circuit is configured to enable or disable the output signal based on the control input signal.

Example 10 is the memory arrangement of either of examples 8 or 9, wherein the operating transistors are further configured to provide an output signal to the memory arrangement indicating the memory state of the remanent-polarizable memory element.

Example 11 is the memory arrangement of example 10, wherein the output signal includes a bad common signal, wherein the operating transistors are configured to provide the bad common signal if the memory state is a bad memory state indicating that the group of memory cells are bad. The operating transistors are also configured to suppress providing the bad common signal if the memory state includes a good memory state indicating that the group of memory cells are good.

Example 12 is the memory arrangement of any one of examples 8 to 11, wherein the operating transistors are configured to provide a voltage drop across the remanent-polarizable memory element in order to set the memory state.

Example 13 is the memory arrangement of example 12, wherein the operating transistors are configured to inhibit the voltage drop across the remanent-polarizable memory element.

Example 14 is the memory arrangement of any one of examples 8 to 13, wherein the memory arrangement is configured to receive control signals to control the operating transistors to set a plurality of operating modes of the driver circuit.

Example 15 is the memory arrangement of example 14, wherein the control signals are configured to provide signal combinations for setting the plurality of operation modes, wherein the first signal combination is configured to cause the driver circuit to operate in an erase operation mode of the remanent-polarizable memory element. In addition, the second signal combination is configured to cause the driver circuit to operate in a programming operation mode of the remanent-polarizable memory element. In addition, the third signal combination is configured to cause the driver circuit to operate in a user operation mode of the group of memory cells.

Example 16 is the memory arrangement of example 15, wherein the erase operation mode includes the driver circuit configured to set the memory state of the remanent-polarizable memory element to a first polarity, wherein the programming operation mode includes the driver circuit configured to set the memory state of the remanent-polarizable memory element to a second polarity that is different from the first polarity.

Example 17 is the memory arrangement of example 16, wherein the first polarity is a positive polarity of the remanent-polarizable memory element, wherein the second polarity is a negative polarity of the remanent-polarizable memory element.

Example 18 is the memory arrangement of example 17, wherein the remanent-polarizable memory element includes a remanent-polarizable field-effect transistor, wherein the negative polarity includes a low voltage threshold state of the remanent-polarizable memory element and the positive polarity includes a high voltage threshold state of the remanent-polarizable memory element.

Example 19 is the memory arrangement of any one of examples 15 to 18, wherein the control signals include an address selection indicating whether the group of memory cells is a selected sector for programming, wherein in the programming operation mode, the driver circuit is configured to, if the group of memory cells is the selected sector, program the memory state of the remanent-polarizable memory element, and if the group of memory cells is not the selected sector, inhibit programing of the memory state of the remanent-polarizable memory element.

Example 20 is the memory arrangement of example 19, wherein the user mode includes the driver circuit configured to enable the operation on the group of memory cells if the memory state indicates a good state for the group of memory cells and to disable the operation if the memory state indicates a bad state for the group of memory cells.

Example 21 is the memory arrangement of example 20, wherein the driver circuit configured to enable the operation on the group of memory cells includes the driver circuit configured to read and/or write the group of memory cells, wherein the driver circuit configured to disable the operation on the group of memory cells includes the driver circuit configured to suppress reading and/or writing the memory cells.

Example 22 is the memory arrangement of any one of examples 1 to 21, wherein the memory state includes one of a plurality of memory states, wherein the plurality of memory states include a first memory state associated with a positive polarity of the remanent-polarizable memory element and a second memory state associated with a negative polarity of the remanent-polarizable memory element.

Example 23 is the memory arrangement of any one of examples 1 to 22, wherein the set of operating transistors are configured to provide a voltage drop across the remanent-polarizable memory element in order to set the memory state, wherein the voltage drop across the remanent-polarizable memory element includes a threshold voltage level sufficient to set the memory state.

Example 24 is the memory arrangement of example 23, wherein the threshold voltage level includes a low voltage threshold associated with a negative polarity of the remanent-polarizable memory element or a high threshold voltage associated with a positive polarity of the remanent-polarizable memory element.

Example 25 is the memory arrangement of any one of examples 14 to 24, the memory arrangement further including a shifting circuit configured to shift an input voltage range of at least one of the control signals to a shifted voltage range that is different from the input voltage range.

Example 26 is the memory arrangement of any one of examples 8 to 25, wherein the operating transistors include a shifting circuit configured to shift an operating voltage range of a least one of the operating transistors to a shifted voltage range that is different from the operating voltage range.

Example 27 is the memory arrangement of either of examples 25 or 26, wherein the shifted voltage range is sufficient to set the memory state of the remanent-polarizable memory element.

Example 28 is a memory arrangement including one or more memory cells and a driver circuit for operating the one or more memory cells, wherein the driver circuit includes a field-effect transistor-based memory element. The driver circuit is configured to enable or disable a user operation of the one or more memory cells based on a memory state of the remanent-polarizable memory element.

Example 29 is the memory arrangement of example 28, wherein the one or more memory cells is a sector of the memory arrangement.

Example 30 is the memory arrangement of either of examples 28 or 29, wherein the driver circuit includes a row driver for a sector of memory cells, wherein the one or more memory cells is the sector of memory cells.

Example 31 is the memory arrangement of any one of examples 28 to 30, wherein the field-effect transistor-based memory element includes a remanent-polarizable field-effect transistor.

Example 32 is the memory arrangement of any one of examples 28 to 31, wherein the driver circuit is configured to enable or disable the user operation based on a control input signal.

Example 33 is the memory arrangement of example 32, wherein the control input signal includes an address input signal representing whether the one or more memory cells is a selected group of memory cells for the user operation.

Example 34 is the memory arrangement of any one of examples 28 to 33, wherein the user operation includes a read operation and/or a write operation on the one or more memory cells.

Example 35 is the memory arrangement of any one of examples 28 to 34, wherein the driver circuit further includes operating transistors configured to set the memory state of the field-effect transistor-based memory element.

Example 36 is the memory arrangement of example 35, wherein at least one of the operating transistors is configured to receive an output signal from the driver circuit to set the memory state of the field-effect transistor-based memory element based on a control input signal to the driver circuit, wherein the driver circuit is configured to enable or disable the output signal based on the control input signal.

Example 37 is the memory arrangement of either of examples 35 or 36, wherein the operating transistors are further configured to provide an output signal to the one or more memory cells indicating the memory state of the field-effect transistor-based memory element.

Example 38 is the memory arrangement of example 37, wherein the output signal includes a bad common signal, wherein the operating transistors are configured to provide the bad common signal if the memory state is a bad memory state indicating that the group of memory cells are bad. The operating transistors are also configured to suppress providing the bad common signal if the memory state includes a good memory state indicating that the group of memory cells are good.

Example 39 is the memory arrangement of any one of examples 35 to 38, wherein the operating transistors are configured to provide a voltage drop across the field-effect transistor-based memory element in order to set the memory state.

Example 40 is the memory arrangement of example 39, wherein the operating transistors are configured to inhibit the voltage drop across the field-effect transistor-based memory element.

Example 41 is the memory arrangement of any one of examples 35 to 40, wherein the memory arrangement is configured to receive control signals to control the operating transistors to set a plurality of operating modes of the driver circuit.

Example 42 is the memory arrangement of example 41, wherein the control signals are configured to provide signal combinations for setting the plurality of operation modes, wherein the first signal combination is configured to cause the driver circuit to operate in an erase operation mode of the field-effect transistor-based memory element. In addition, the second signal combination is configured to cause the driver circuit to operate in a programming operation mode of the field-effect transistor-based memory element. In addition, the third signal combination is configured to cause the driver circuit to operate in the user operation mode of the one or more memory cells.

Example 43 is the memory arrangement of example 42, wherein the erase operation mode includes the driver circuit configured to set the memory state of the field-effect transistor-based memory element to a first polarity, wherein the programming operation mode includes the driver circuit configured to set the memory state of the field-effect transistor-based memory element to a second polarity that is different from the first polarity.

Example 44 is the memory arrangement of example 43, wherein the first polarity is a positive polarity of the field-effect transistor-based memory element, wherein the second polarity is a negative polarity of the field-effect transistor-based memory element.

Example 45 is the memory arrangement of example 44, wherein the field-effect transistor-based memory element includes a remanent-polarizable field-effect transistor, wherein the negative polarity includes a low voltage threshold state of the remanent-polarizable field-effect transistor and the positive polarity includes a high voltage threshold state of the remanent-polarizable field-effect transistor.

Example 46 is the memory arrangement of any one of examples 42 to 45, wherein the control signals include an address selection indicating whether the one or more memory cells is a selected sector for programming, wherein in the programming operation mode, the driver circuit is configured to, if the one or more memory cells is the selected sector, program the memory state of the field-effect transistor-based memory element, and if the group of memory cells is not the selected sector, inhibit programing of the memory state of the field-effect transistor-based memory element.

Example 47 is the memory arrangement of example 46, wherein the user operation includes the driver circuit configured to enable the user operation on the one or more memory cells if the memory state indicates a good state and to disable the user operation if the memory state indicates a bad state.

Example 48 is the memory arrangement of example 47, wherein the driver circuit configured to enable the user operation of the one or more memory cells includes the driver circuit configured to read and/or write the one or more memory cells, wherein the driver circuit configured to disable the user operation of the one or more memory cells includes the driver circuit configured to suppress reading and/or writing the one or more memory cells.

Example 49 is the memory arrangement of any one of examples 28 to 48, wherein the memory state includes one of a plurality of memory states, wherein the plurality of memory states includes a first memory state associated with a positive polarity of the field-effect transistor-based memory element and a second memory state associated with a negative polarity of the field-effect transistor-based memory element.

Example 50 is the memory arrangement of any one of examples 28 to 49, wherein a set of operating transistors are configured to provide a voltage drop across the field-effect transistor-based memory element in order to set the memory state, wherein the voltage drop across the field-effect transistor-based memory element includes a threshold voltage level sufficient to set the memory state.

Example 51 is the memory arrangement of example 50, wherein the threshold voltage level includes a low voltage threshold associated with a negative polarity of the field-effect transistor-based memory element or a high threshold voltage associated with a positive polarity of the field-effect transistor-based memory element.

Example 52 is the memory arrangement of any one of examples 41 to 51, the memory arrangement further including a shifting circuit configured to shift an input voltage range of at least one of the control signals to a shifted voltage range that is different from the input voltage range.

Example 53 is the memory arrangement of any one of examples 35 to 52, wherein the operating transistors include a shifting circuit configured to shift an operating voltage range of a least one of the operating transistors to a shifted voltage range that is different from the operating voltage range.

Example 54 is the memory arrangement of either of examples 52 or 53, wherein the shifted voltage range is sufficient to set the memory state of the remanent-polarizable memory element.

Example 55 is a method for operating a sector of memory cells. The method includes determining a polarization state of a state-programmable memory element associated with the sector, wherein the polarization state includes either a first polarization state indicating the sector is good or a second polarization state indicating the sector is bad. The method also includes operating the sector of memory cells if the determined polarization state is the first polarization state and suppressing operating the sector of memory cells if the determined polarization state is the second polarization state.

Example 56 is the method of example 55, wherein the state-programmable memory element includes a remanent-polarizable field-effect transistor.

Example 57 is the method of either of examples 55 or 56, wherein operating the sector of memory cells comprises reading from and/or writing to the memory cells.

Example 58 is the method of any one of examples 55 to 57, the method further including providing an output signal to the sector indicating the polarization state of the state-programmable memory element.

Example 59 is the method of any one of examples 55 to 58, the method further including providing a bad common signal if the polarization state is the second polarization state, the method further including suppressing the bad common signal if the polarization state is the first polarization state.

Example 60 is the method of any one of examples 55 to 59, the method further including setting the polarization state by providing a voltage drop across the state-programmable memory element.

Example 61 is the method of example 60, the method further including inhibiting the voltage drop across the remanent-polarizable memory element.

Example 62 is the method of any one of examples 55 to 61, the method further including receiving control signals for setting a plurality of operating modes associated with the state-programmable memory element.

Example 63 is the method of example 62, the method further including setting the operating mode from the plurality of operating modes based on the control signals, wherein the plurality of operating modes include an erase operation mode of the state-programmable memory element, a programming operation mode of the state-programmable memory element, and a user operation mode of the sector of memory cells.

Example 64 is the method of example 63, wherein the erase operation mode includes setting the polarization state of the state-programmable memory element to a first polarity, wherein the programming operation mode includes setting the polarization state of the state-programmable memory element to a second polarity that is different from the first polarity.

Example 65 is the method of example 64, wherein the first polarity is a positive polarity of the state-programmable memory element, wherein the second polarity is a negative polarity of the state-programmable memory element.

Example 66 is the method of example 65, wherein the state-programmable memory element includes a remanent-polarizable field-effect transistor, wherein the negative polarity includes a low voltage threshold state of the remanent-polarizable field-effect transistor and the positive polarity includes a high voltage threshold state of the remanent-polarizable field-effect transistor.

Example 67 is the method of any one of examples 55 to 66, the method further including receiving an address selection signal indicating whether the sector of memory cells is a selected sector for programming; and, if the sector of memory cells is the selected sector, programming the polarization state of the state-programmable memory element, and if the sector of memory cells is not the selected sector, inhibiting programing of the polarization state of the state-programmable memory element.

Example 68 is the method of example 67, the method further including enabling the operation on the sector of memory cells if the memory state indicates a good state for the sector of memory cells and to disable the operation if the memory state indicates a bad state for the sector of memory cells.

Example 69 is the method of any one of examples 55 to 68, wherein the polarization state includes one of a plurality of polarization states, wherein the plurality of polarization states include a first polarization state associated with a positive polarity of the state-programmable memory element and a second polarization state associated with a negative polarity of the state-programmable memory element.

Example 70 is the method of any one of examples 55 to 69, the method further comprising providing a voltage drop across the state-programmable memory element, wherein the provided voltage drop across the state-programmable memory element includes a threshold voltage level sufficient to set the polarization state.

Example 71 is the method of example 70, wherein the threshold voltage level includes a low voltage threshold associated with a negative polarity of the state-programmable memory element or a high threshold voltage associated with a positive polarity of the state-programmable memory element.

Example 72 is the method of any one of examples 62 to 71, the method further including shifting an input voltage range of at least one of the received control signals to a shifted voltage range that is different from the input voltage range.

Example 73 is the method of example 72, wherein the shifted voltage range is sufficient to set the polarization state of the state-programmable memory element.

The terms "at least one" and "one or more" may be understood to include any integer number greater than or equal to one, i.e. one, two, three, four, [ . . . ], etc. The term "a plurality" or "a multiplicity" may be understood to include any integer number greater than or equal to two, i.e. two, three, four, five, [ . . . ], etc. The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

The term "connected" may be used herein with respect to nodes, terminals, integrated circuit elements, and the like, to mean electrically connected, which may include a direct connection or an indirect connection, wherein an indirect connection may only include additional structures in the current path that do not influence the substantial functioning of the described circuit or device.

While the invention has been particularly shown and described with reference to specific aspects, it should be understood by those skilled in the art that various changes in form and detail may be made therein without departing from the spirit and scope of the invention as defined by the appended claims. The scope of the invention is thus indicated by the appended claims and all changes, which come within the meaning and range of equivalency of the claims, are therefore intended to be embraced.

The invention claimed is:

1. A memory arrangement comprising:
   a group of memory cells; and
   a driver circuit for operating the group of memory cells, wherein the driver circuit comprises a remanent-polarizable memory element and operating transistors, wherein the operating transistors are configured to set a memory state of the remanent-polarizable memory element, and
   wherein the driver circuit is configured to enable or disable an operation of the group of memory cells based on the memory state of the remanent-polarizable memory element.

2. The memory arrangement of claim 1, wherein the driver circuit comprises a row driver for a sector of memory cells, wherein the group of memory cells comprises the sector of memory cells.

3. The memory arrangement of claim 1, wherein the remanent-polarizable memory element comprises a remanent-polarizable field-effect transistor.

4. The memory arrangement of claim 1, wherein the driver circuit is configured to enable or disable an output signal of the driver circuit based on a control input signal.

5. The memory arrangement of claim 4, wherein the control input signal comprises an address input signal representing whether the group of memory cells is a selected group of memory cells for the operation.

6. The memory arrangement of claim 1, wherein the operation comprises a read operation and/or a write operation on the group of memory cells.

7. The memory arrangement of claim 1, wherein at least one of the operating transistors is configured to receive an output signal from the driver circuit to set the memory state of the remanent-polarizable memory element based on a control input signal to the driver circuit, wherein the driver circuit is configured to enable or disable the output signal based on the control input signal.

8. The memory arrangement of claim 1, wherein the operating transistors are further configured to provide an output signal to the memory arrangement indicating the memory state of the remanent-polarizable memory element.

9. The memory arrangement of claim 1, wherein the operating transistors are configured to provide a voltage drop across the remanent-polarizable memory element in order to set the memory state.

10. The memory arrangement of claim 1, wherein the memory arrangement is configured to receive control signals to control the operating transistors to set a plurality of operating modes of the driver circuit.

11. The memory arrangement of claim 10, wherein the control signals are configured to provide signal combinations for setting the plurality of operation modes, wherein:
   a first signal combination is configured to cause the driver circuit to operate in an erase operation mode of the remanent-polarizable memory element;
   a second signal combination is configured to cause the driver circuit to operate in a programming operation mode of the remanent-polarizable memory element; and
   a third signal combination is configured to cause the driver circuit to operate in a user operation mode of the group of memory cells.

12. The memory arrangement of claim 11, wherein the erase operation mode comprises the driver circuit configured to set the memory state of the remanent-polarizable memory element to a first polarity, wherein the programming operation mode comprises the driver circuit configured to set the memory state of the remanent-polarizable memory element to a second polarity that is different from the first polarity.

13. The memory arrangement of claim 12, wherein the first polarity is a positive polarity of the remanent-polarizable memory element, wherein the second polarity is a negative polarity of the remanent-polarizable memory element.

14. The memory arrangement of claim 13, wherein the remanent-polarizable memory element comprises a remanent-polarizable field-effect transistor, wherein the negative polarity comprises a low voltage threshold state of the remanent-polarizable memory element and the positive polarity comprises a high voltage threshold state of the remanent-polarizable memory element.

15. The memory arrangement claim 11, wherein the control signals include an address selection indicating whether the group of memory cells is a selected sector for programming, wherein in the programming operation mode, the driver circuit is configured to, if the group of memory cells is the selected sector, program the memory state of the remanent-polarizable memory element, and if the group of memory cells is not the selected sector, inhibit programing of the memory state of the remanent-polarizable memory element.

16. The memory arrangement of claim 1, wherein the operating transistors are configured to provide a voltage drop across the remanent-polarizable memory element, wherein the voltage drop across the remanent-polarizable memory element comprises a threshold voltage level sufficient to set the memory state.

17. The memory arrangement of claim 10, the memory arrangement further comprising a shifting circuit configured to shift an input voltage range of at least one of the control signals to a shifted voltage range that is different from the input voltage range.

18. The memory arrangement of claim 17, wherein the shifted voltage range is sufficient to set the memory state of the remanent-polarizable memory element.

* * * * *